US011563087B2

(12) United States Patent
Liaw

(10) Patent No.: US 11,563,087 B2
(45) Date of Patent: Jan. 24, 2023

(54) FIN-BASED STRAP CELL STRUCTURE

(71) Applicant: Taiwan Semiconductor Manufacturing Co., Ltd., Hsin-Chu (TW)

(72) Inventor: Jhon Jhy Liaw, Hsinchu County (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 101 days.

(21) Appl. No.: 17/208,838

(22) Filed: Mar. 22, 2021

(65) Prior Publication Data

US 2021/0210603 A1 Jul. 8, 2021

Related U.S. Application Data

(63) Continuation of application No. 16/853,012, filed on Apr. 20, 2020, now Pat. No. 10,957,766, which is a (Continued)

(51) Int. Cl.
*H01L 29/10* (2006.01)
*H01L 23/522* (2006.01)
(Continued)

(52) U.S. Cl.
CPC ...... *H01L 29/1079* (2013.01); *H01L 23/5226* (2013.01); *H01L 27/0886* (2013.01);
(Continued)

(58) Field of Classification Search
CPC ............. H01L 29/1079; H01L 29/0847; H01L 29/66545; H01L 23/5226; H01L 27/0886; H01L 27/1104
(Continued)

(56) References Cited

U.S. PATENT DOCUMENTS 6,768,144 B2 7/2004 Houston et al.
7,586,147 B2 9/2009 Liaw
(Continued)

FOREIGN PATENT DOCUMENTS

KR 100650870 7/2008
KR 20150073119 6/2015
(Continued)

OTHER PUBLICATIONS

U.S. Appl. No. 10/157,987, filed Dec. 18, 2018, Liaw.
U.S. Appl. No. 10/163,914, filed Dec. 25, 2018, Zhang et al.

*Primary Examiner* — Tu-Tu V Ho
(74) *Attorney, Agent, or Firm* — Haynes and Boone, LLP

(57) ABSTRACT

Fin-based well straps are disclosed herein for improving performance of memory arrays, such as static random access memory arrays. An exemplary integrated circuit (IC) device includes a FinFET disposed over a doped region of a first type dopant. The FinFET includes a first fin structure doped with a first dopant concentration of the first type dopant and first source/drain features of a second type dopant. The IC device further includes a fin-based well strap disposed over the doped region of the first type dopant. The fin-based well strap connects the doped region to a voltage. The fin-based well strap includes a second fin structure doped with a second dopant concentration of the first type dopant and second source/drain features of the first type dopant. The second dopant concentration is greater than (for example, at least three times greater than) the first dopant concentration.

20 Claims, 12 Drawing Sheets

Related U.S. Application Data continuation of application No. 16/196,074, filed on Nov. 20, 2018, now Pat. No. 10,629,684, which is a continuation of application No. 15/827,443, filed on Nov. 30, 2017, now Pat. No. 10,157,987.

(60) Provisional application No. 62/545,084, filed on Aug. 14, 2017.

(51) Int. Cl.

| | |
|---|---|
| ***H01L 27/11*** | (2006.01) |
| ***H01L 27/088*** | (2006.01) |
| *H01L 29/08* | (2006.01) |
| *H01L 29/66* | (2006.01) |

(52) U.S. Cl.
CPC ...... *H01L 27/1104* (2013.01); *H01L 29/0847* (2013.01); *H01L 29/66545* (2013.01)

(58) Field of Classification Search
USPC .......................................................... 257/369
See application file for complete search history.

(56) References Cited

U.S. PATENT DOCUMENTS

| | | | | |
|---|---|---|---|---|
| 8,693,235 | B2 | 4/2014 | Liaw | |
| 9,406,681 | B2 | 8/2016 | Liaw | |
| 9,607,685 | B2 | 3/2017 | Liaw | |
| 9,608,062 | B1 | 3/2017 | Tseng | |
| 9,627,478 | B1 | 4/2017 | Leobandung | |
| 9,646,973 | B2 | 5/2017 | Liaw | |
| 9,691,471 | B2 | 6/2017 | Liaw | |
| 10,490,558 | B2 * | 11/2019 | Choi | H01L 23/5286 |
| 2007/0029622 | A1 | 2/2007 | Park | |
| 2013/0126985 | A1 | 5/2013 | Cheng et al. | |
| 2014/0153321 | A1 | 6/2014 | Liaw | |
| 2015/0179503 | A1 | 6/2015 | Tsai et al. | |
| 2016/0049410 | A1 | 2/2016 | Seshadri et al. | |
| 2016/0372182 | A1 | 12/2016 | Liaw | |
| 2017/0032835 | A1 | 2/2017 | Liaw | |

FOREIGN PATENT DOCUMENTS

| | | |
|---|---|---|
| KR | 20170015074 | 2/2017 |
| TW | 2016-42474 | 12/2016 |

* cited by examiner

FIN-BASED STRAP CELL STRUCTURE

This is a continuation application of U.S. patent application Ser. No. 16/853,012, filed Apr. 20, 2020, which is a continuation application of U.S. patent application Ser. No. 16/196,074, filed Nov. 20, 2018, now U.S. Pat. No. 10,629,684, which is a continuation application of U.S. patent application Ser. No. 15/827,443, filed Nov. 30, 2017, now U.S. Pat. No. 10,157,987, which is a non-provisional application of and claims benefit of U.S. Provisional Patent Application Ser. No. 62/545,084, filed Aug. 14, 2017, the entire disclosures of all of which are incorporated herein by reference.

BACKGROUND

Static random access memory ("SRAM") generally refers to any memory or storage that can retain stored data only when power is applied. As integrated circuit (IC) technologies progress towards smaller technology nodes, SRAMs often incorporate fin-based structures, such as fin-like field effect transistors (FinFETs), into SRAM cells to enhance performance, where each SRAM cell can store a bit of data. Since SRAM cell performance is largely layout dependent (for example, it has been observed that an inner SRAM cell of a SRAM array will perform differently than an edge SRAM cell of the SRAM array), fin-based well strap cells have been implemented to stabilize well potential, facilitating uniform charge distribution throughout a SRAM array, and thus uniform performance among SRAM cells of the SRAM array. However, as fin dimensions shrink, fin-based well strap cells have been observed to increase pick-up resistance and/or reduce latch-up performance of SRAM arrays. Accordingly, although existing well strap cells for SRAM arrays have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
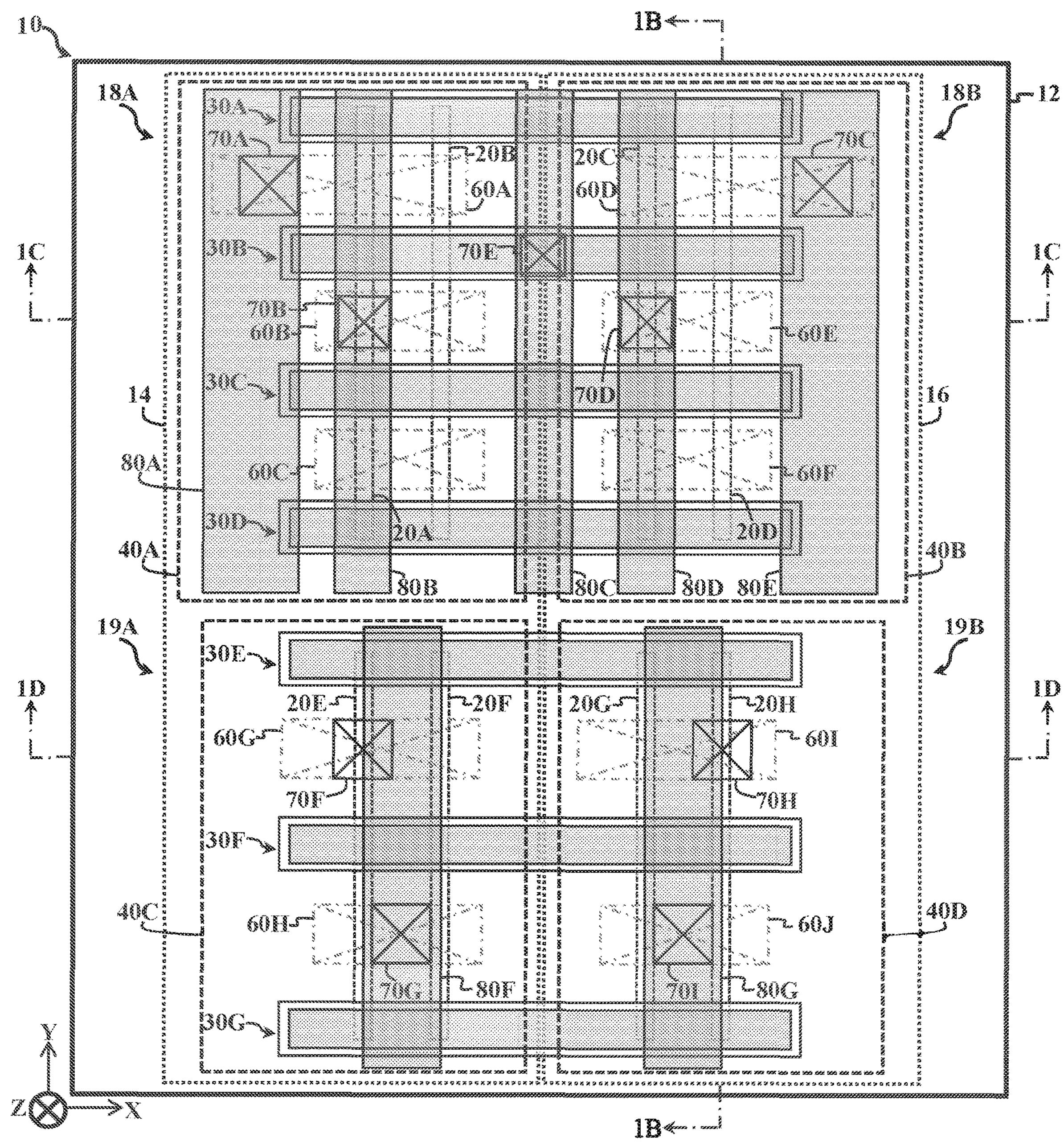
FIGS. 1A-1D are fragmentary diagrammatic views of a FinFET device, in portion or entirety, according to various aspects of the present disclosure.

The present disclosure relates generally to integrated circuit (IC) devices, and more particularly, to fin-based strap cell structures for IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

For advanced IC technology nodes, fin-like field effect transistors (FinFETs) (also referred to as non-planar transistors) have become a popular and promising candidate for high performance and low leakage applications. Memory arrays, such as static random access memory (SRAM) arrays, often incorporate FinFETs into memory cells to enhance performance, where each memory cell can store a bit of data. Memory cell performance is largely layout dependent. For example, it has been observed that an inner memory cell of a memory array will perform differently than an edge memory cell of the memory array. In some implementations, inner memory cells and edge memory cells exhibit different threshold voltages ($V_t$), different on-currents ($I_{on}$), and/or a different off-currents ($I_{off}$). Fin-based well strap cells have thus been implemented to stabilize well potential, facilitating uniform charge distribution throughout a memory array, and thus uniform performance among memory cells of the memory array. A fin-based well strap (also referred to as an electrical tie) electrically connects a well region corresponding with a FinFET of a memory cell to a voltage node (or voltage line). For example, a fin-based n-type well strap electrically connects an n-well region corresponding with a p-type FinFET to a voltage node, such as a voltage node associated with the p-type transistor, and a fin-based p-type well strap electrically connects a p-well region corresponding with an n-type FinFET to a voltage node, such as a voltage node associated with the n-type transistor.

As FinFET technologies progress towards smaller technology nodes (for example, 20 nm, 16 nm, 10 nm, 7 nm, and below), decreasing fin pitch and decreasing fin width have been observed to diminish benefits provided by fin-based well straps. For example, decreasing fin widths have been observed to increase well pick-up resistance, such that a well pick-up resistance of fin-based (non-planar based) well straps is much higher than a well pick-up resistance of planar-based well straps. Such increases in well pick-up resistance have been observed to degrade latch-up performance of memory arrays using fin-based well straps. The present disclosure thus proposes modifications to fin-based well straps that can achieve significant improvements in performance. For example, as described herein, increasing a dopant concentration of a fin of a fin-based well strap relative to a doping concentration of a fin of a FinFET corresponding with the fin-based well strap has been observed to significantly reduce well pick-up resistance associated with the fin-based well strap without affecting desired characteristics of the FinFET (for example, voltage threshold). It has further been observed that reducing the well-pick up resistance as described herein improves latch-up immunity of a memory array incorporating the fin-based well strap. Different embodiments may have different advantages, and no particular advantage is necessarily required of any embodiment.

Figure 1B:
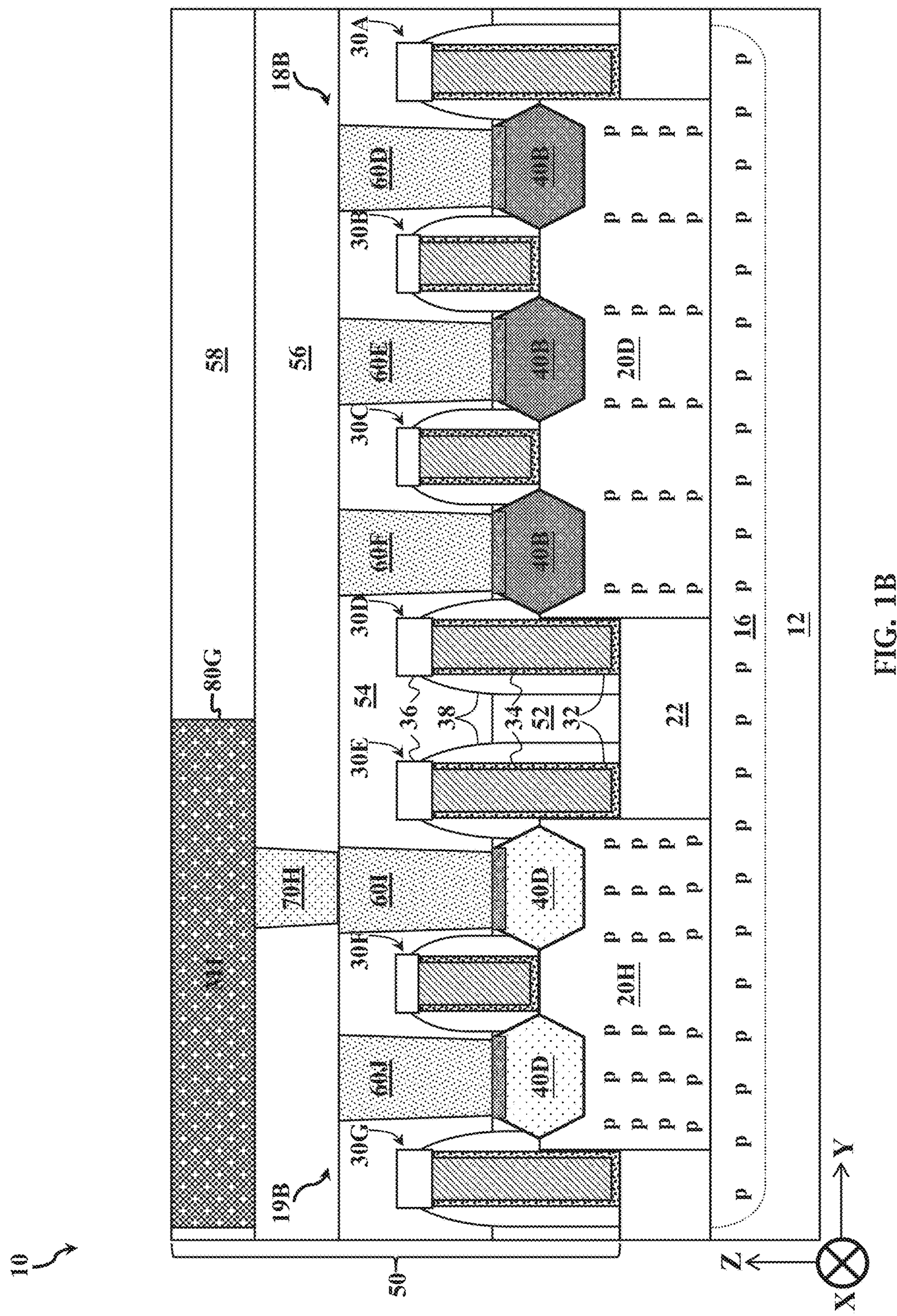
Figure 1C:
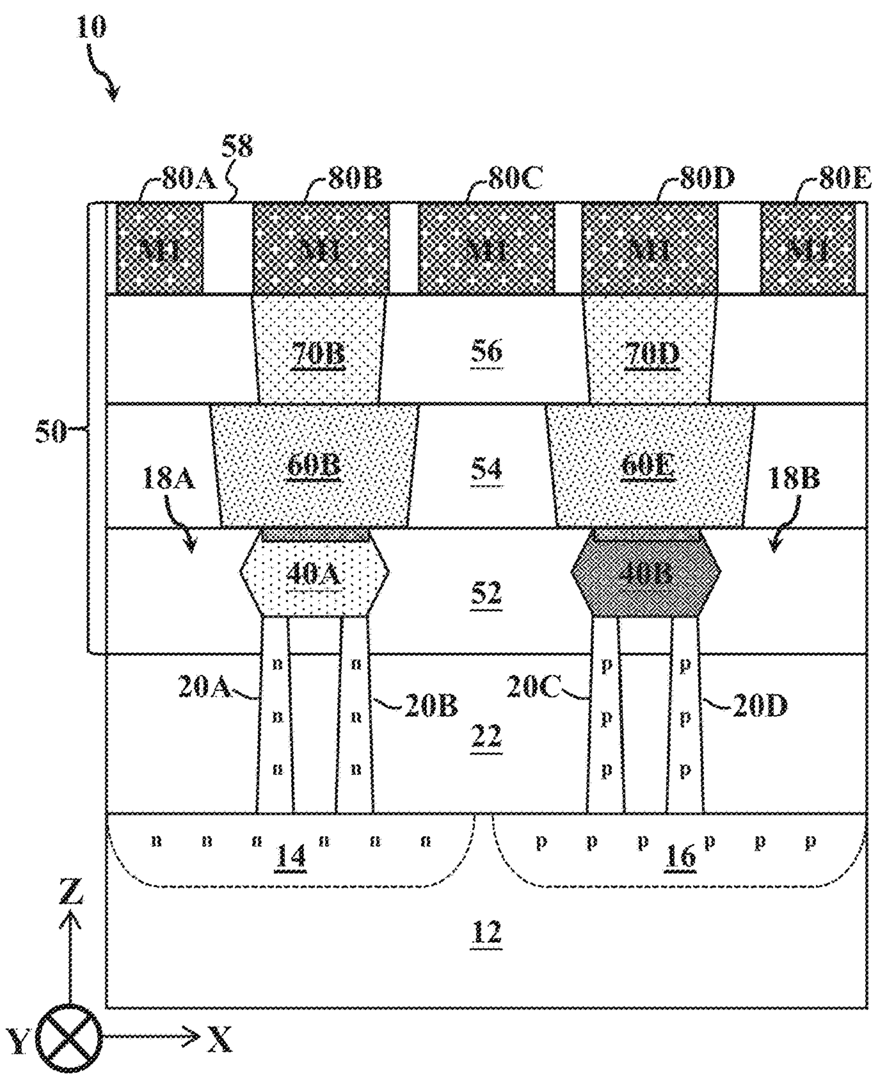
Figure 1D:
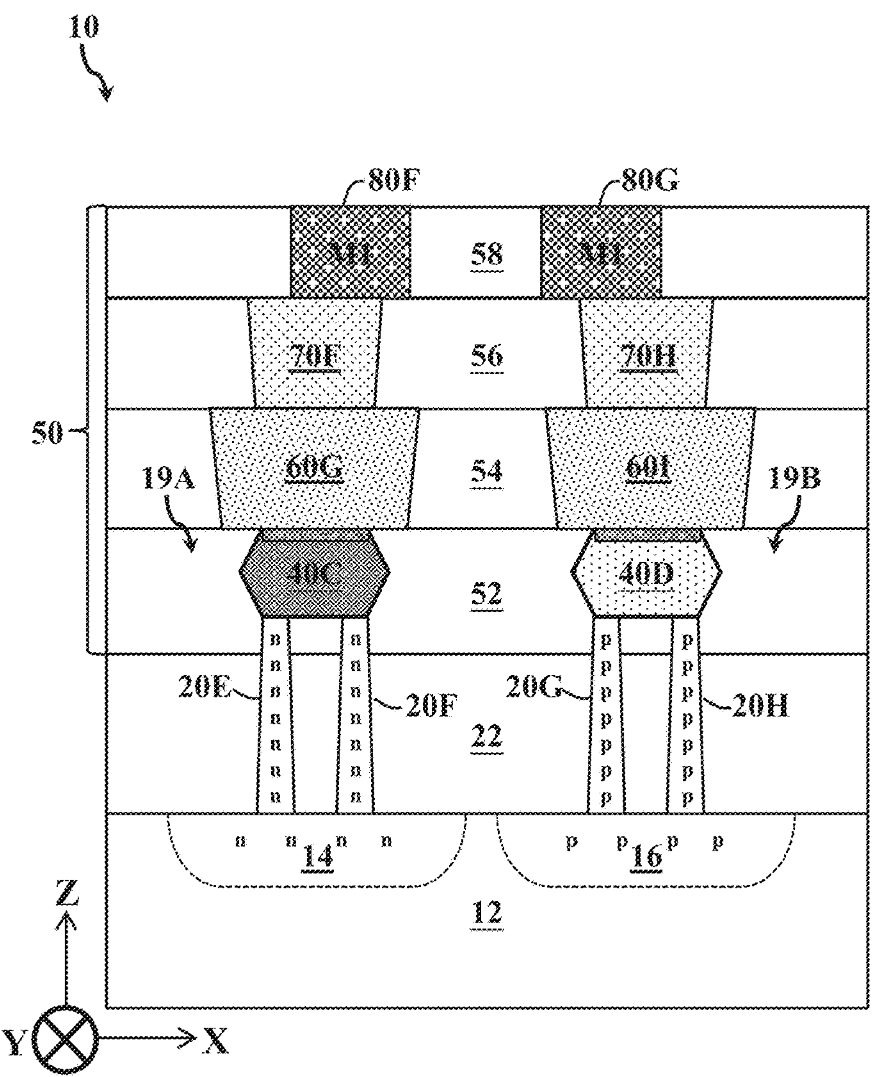

FIGS. 1A-1D are fragmentary diagrammatic views of a FinFET device 10, in portion or entirety, according to various aspects of the present disclosure. In particular, FIG. 1A is a simplified schematic top view of FinFET device 10 (for example, in an x-y plane); FIG. 1B is a diagrammatic cross-sectional view of FinFET device 10 along line 1B-1B of FIG. 1A (for example, in a y-z plane); FIG. 1C is a diagrammatic cross-sectional view of FinFET device 10 along line 1C-1C of FIG. 1A (for example, in an x-z plane); and FIG. 1D is a diagrammatic cross-sectional view of FinFET device 10 along line 1D-1D of FIG. 1A (for example, in an x-z plane). FinFET device 10 generally refers to any fin-based device, which can be included in a microprocessor, a memory cell, and/or other IC device. In some implementations, FinFET device 10 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIGS. 1A-1D have been simplified for the sake of clarity to better understand the inventive concepts of the present disclosure. Additional features can be added in FinFET device 10, and some of the features described below can be replaced, modified, or eliminated in other embodiments of FinFET device 10.

FinFET device 10 includes a substrate (wafer) 12. In the depicted embodiment, substrate 12 includes silicon. Alternatively or additionally, substrate 12 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as SiGe, SiPC, GaAsP, AlInAs, AlGaAs, GaInAs, GaInP, and/or GaInAsP; or combinations thereof. Alternatively, substrate 12 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some implementations, substrate 12 includes one or more group III-V materials. In some implementations, substrate 12 includes one or more group II-IV materials.

Substrate 12 includes various doped regions configured according to design requirements of FinFET device 10. In some implementations, substrate 12 includes p-type doped regions (for example, p-type wells) doped with p-type dopants, such as boron (for example, $BF_2$), indium, other p-type dopant, or combinations thereof. In some implementations, substrate 12 includes n-type doped regions (for example, n-type wells) doped with n-type dopants, such as phosphorus, arsenic, other n-type dopant, or combinations thereof. In some implementations, substrate 12 includes doped regions formed with a combination of p-type dopants and n-type dopants. The various doped regions can be formed directly on and/or in substrate 12, for example, providing a p-well structure, an n-well structure, a dual-well structure, a raised structure, or combinations thereof. An ion implantation process, a diffusion process, and/or other suitable doping process can be performed to form the various doped regions. In the depicted embodiment, substrate 12 includes an n-type doped region 14 (also referred to as an n-well) configured for a p-type metal-oxide-semiconductor (PMOS) FinFET 18A, such as a pull-up (PU) FinFET, and a p-type doped region 16 (also referred to as a p-well) configured for an n-type MOS (NMOS) FinFET 18B, such as a pull-down (PD) FinFET, such that FinFET device 10 includes a CMOS FinFET. An n-type well strap 19A is configured to electrically connect n-type doped region 14 to a first power supply voltage, such as a power supply voltage $V_{DD}$, and a p-type well strap 19B is configured to electrically connect p-type doped region 16 to a second power supply voltage, such as a power supply voltage Vss. In some implementations, power supply voltage $V_{DD}$ is a positive power supply voltage, and power supply voltage $V_{SS}$ is an electrical ground. In some implementations, n-type doped region 14 has an n-type dopant concentration of about $5\times10^{16}$ $cm^{-3}$ to about $5\times10^{19}$ $cm^3$, and p-type doped region 16 has a p-type dopant concentration of about $5\times10^{16}$ $cm^{-3}$ to about $5\times10^{19}$ $cm^{-3}$.

FinFET device 10 includes a fin 20A, a fin 20B, a fin 20C, a fin 20D, a fin 20E, a fin 20F, a fin 20G, and a fin 20H (also referred to as active fin regions) disposed over substrate 12. In FIGS. 1A-1D, P-type FinFET 18A includes fin 20A and fin 20B disposed over (and electrically connected to) n-type doped region 14, N-type FinFET 18B includes fin 20C and fin 20D disposed over (and electrically connected to) p-type doped region 16, n-type well strap 19A includes fin 20E and fin 20F disposed over (and electrically connected to) n-type doped region 14, and p-type well strap 19B includes fin 20G and fin 20H disposed over (and electrically connected to) p-type doped region 16. To enhance performance of FinFET device 10, a dopant concentration of fins of the FinFETs is less than a doping concentration of fins of the well straps. For example, in the depicted embodiment, fins 20A, 20B of P-type FinFET 18A include n-type dopants (represented by n) and fins 20E, 20F of n-type well strap 19A include n-type dopants (represented by n), where an n-type dopant concentration of fins 20E, 20F is greater than an n-type dopant concentration of fins 20A, 20B. In some implementations, the n-type dopant concentration of fins 20E, 20F is at least three times greater than the n-type dopant concentration of fins 20A, 20B. For example, fins 20A, 20B have an n-type dopant concentration of about $1\times10^{15}$ $cm^{-3}$ to about $1\times10^{18}$ $cm^{-3}$, while fins 20E, 20F have an n-type dopant concentration of $1\times10^{15}$ $cm^{-3}$ to about $5\times10^{18}$ $cm^{-3}$. In some implementations, the n-type dopant concentration of n-type doped region 14 is greater than the n-type dopant concentration of fins 20A, 20B and is less than the n-type dopant concentration of fins 20E, 20F. In furtherance of the depicted embodiment, fins 20C, 20D of N-type FinFET 18B include p-type dopants (represented by p) and fins 20G, 20H of p-type well strap 19B include p-type dopants (represented by p), where a p-type dopant concentration of fins 20G, 20H is greater than a p-type dopant concentration of fins 20C, 20D. In some implementations, the p-type dopant concentration of fins 20G, 20H is at least three times greater than the p-type dopant concentration of fins 20C, 20D. For example, fins 20C, 20D have a p-type dopant concentration of about $1\times10^{15}$ $cm^{-3}$ to about $1\times10^{18}$ $cm^{-3}$, while fins 20G, 20H have a p-type dopant concentration of about $5\times10^{16}$ $cm^{3}$ to about $5\times10^{19}$ $cm^{3}$. In some implementations, the p-type dopant concentration of p-type doped region 16 is greater than the p-type dopant concentration of fins 20C, 20D and is less than the p-type dopant concentration of fins 20G, 20H.

P-type FinFET 18A and N-type FinFET 18B are multi-fin FinFETs and n-type well strap 19A and p-type well strap 19B are multi-fin well straps, though the present disclosure contemplates embodiments where P-type FinFET 18A, N-type FinFET 18B, n-type well strap 19A, and/or p-type well strap 19B include more or less fins, such as a single fin). Fins 20A-20H are oriented substantially parallel to one another, each having a width defined in an x-direction, a length defined in a y-direction, and a height defined in a z-direction. The present disclosure contemplates variations in height, width, and length of fins 20A-20H that may arise from processing and fabrication. For example, in FIG. 1C and FIG. 1D, a width of fins 20A-20H varies from an upper portion of fins 20A-20H to a lower portion of fins 20A-20H. In the depicted embodiment, the width tapers from the upper portion of fins 20A-20H to the lower portion of fins 20A-20H, such that an average width of the upper portion is less than an average width of the lower portion. In some implementations, the width can vary from about 5 nm to about 15 nm along fins 20A-20H depending on where the width is measured along the height of fins 20A-20H. In some implementations, a width of fins 20A-20H varies depending on a position of fins 20A-20H relative to one another and/or relative to other features of FinFET device 10. For example, a width of center fins may be greater than a width of edge fins. In another example, alternatively, a width of center fins is less than a width of edge fins. In both such implementations, the width of edge fins can represent an average width of edge fins, and the width of center fins can represent an average width of center fins. In some implementations, a width of fins 20A, 20B of P-type FinFET 18A is different than a width of fins 20C, 20D of N-type FinFET 18B. In some implementations, the widths are not tapered, such that at least one of fins 20A-20H have substantially the same width along their height.

Fins 20A-20H each have at least one channel region, at least one source region, and at least one drain region defined along their length in the y-direction, where a channel region is disposed between a source region and a drain region (generally referred to as source/drain regions). Channel regions include a top portion defined between sidewall portions, where the top portion and the sidewall portions engage with a gate structure (as described below), such that current can flow between the source/drain regions during operation. The source/drain regions also include top portions defined between sidewall portions. In some implementations, fins 20A-20H are a portion of substrate 12 (such as a portion of a material layer of substrate 12). For example, where substrate 12 includes silicon, fins 20A-20H include silicon. Alternatively, in some implementations, fins 20A-20H are defined in a material layer, such as one or more semiconductor material layers, overlying substrate 12. For example, fins 20A-20H can include a semiconductor layer stack having various semiconductor layers (such as a heterostructure) disposed over substrate 12. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of FinFET device 10. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, SiGe/Si/SiGe/Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b/Si_cGe_d/Si_aGe_b/Si_cGe_d/Si_aGe_b/Si_cGe_d$ from bottom to top, where a, c are different atomic percentages of silicon and b, d are different atomic percentages of germanium).

Fins 20A-20H are formed over substrate 12 by any suitable process. In some implementations, a combination of deposition, lithography and/or etching processes are performed to define fins 20A-20H extending from substrate 12 as illustrated in FIGS. 1A-1D. For example, forming fins 20A-20H includes performing a lithography process to form a patterned resist layer over substrate 12 (or a material layer, such as a heterostructure, disposed over substrate 12) and performing an etching process to transfer a pattern defined in the patterned resist layer to substrate 12 (or the material layer, such as the heterostructure, disposed over substrate 12). The lithography process can include forming a resist layer on substrate 12 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed)

portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of substrate 12 (or a material layer disposed over substrate 12). The etching process can include a dry etching process (for example, a reactive ion etching (RIE) process), a wet etching process, other suitable etching process, or combinations thereof. After the etching process, the patterned resist layer is removed from substrate 12, for example, by a resist stripping process. Alternatively, fins 20A-20H are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some implementations, directed self-assembly (DSA) techniques are implemented while forming fins 20A-20H. Further, in some implementations, the exposure process can implement maskless lithography, electron-beam (e-beam) writing, ion-beam writing, and/or nanoimprint technology for patterning the resist layer and/or other layers.

In some implementations, doped region 14 and/or doped region 16 are formed after forming fins 20A-20H. In such implementations, a lithography process is performed to mask (cover) fins 20C, 20D, 20G, and 20H when forming doped region 14 (for example, by an ion implantation process and/or a diffusion process), and a lithography process is performed to mask fins 20A, 20B, 20E, and 20F when forming doped region 16 (for example, by an ion implantation process and/or a diffusion process). In some implementations, doped region 14 and/or doped region 16 are formed before forming fins 20A-20H. In some implementations, additional lithography processes and/or doping processes are performed to increase a dopant concentration in fins of n-type well strap 19A and/or fins of p-type well strap 19B. For example, a lithography process is performed to mask fins 20A-20D, fin 20G, and fin 20H when a doping process is performed to increase a dopant concentration of fin 20E and fin 20F of n-type well strap 19A. In another example, a lithography process is performed to mask fins 20A-20D, fin 20E, and fin 20F when a doping process is performed to increase a dopant concentration of fin 20G and fin 20H of p-type well strap 19A. Any suitable doping process is contemplated by the present disclosure for increasing a dopant concentration of fins 20E-20H.

An isolation feature(s) 22 is formed over and/or in substrate 12 to isolate various regions, such as various device regions, of FinFET device 10. For example, isolation feature 22 separates and isolates active device regions and/or passive device regions from each other, such as P-type FinFET 18A, N-type FinFET 18B, n-type well strap 19A, and p-type well strap 19B. Isolation feature 22 further separates and isolates fins 20A-20H from one another. In the depicted embodiment, isolation feature 22 surrounds a bottom portion of fins 20A-20H. Isolation feature 22 includes silicon oxide, silicon nitride, silicon oxynitride, other suitable isolation material (for example, including silicon, oxygen, nitrogen, carbon, or other suitable isolation constituent), or combinations thereof. Isolation feature 22 can include different structures, such as shallow trench isolation (STI) structures, deep trench isolation (DTI) structures, and/or local oxidation of silicon (LOCOS) structures. In some implementations, STI features can be formed by etching a trench in substrate 12 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation feature 22. In some implementations, STI features can be formed by depositing an insulator material over substrate 12 after forming fins 20A-20H, such that the insulator material layer fills gaps (trenches) between fins 20A-20H, and etching back the insulator material layer to form isolation feature 22. In some implementations, isolation feature 22 includes a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation feature 22 includes a dielectric layer disposed over a doped liner layer (including, for example, boron silicate glass (BSG) or phosphosilicate glass (PSG)).

Various gate structures are disposed over fins 20A-20H, such as a gate structure 30A, a gate structure 30B, a gate structure 30C, a gate structure 30D, a gate structure 30E, a gate structure 30F, and a gate structure 30G. Gate structures 30A-30G extend along the x-direction (for example, substantially perpendicular to fins 20A-20H). In the depicted embodiment, gate structure 30B and gate structure 30C are disposed over the channel regions of fins 20A-20D. In some implementations, gate structure 30B and gate structure 30C wrap respective channel regions of fins 20A-20D, thereby interposing respective source/drain regions of fins 20A-20D. Gate structure 30B and gate structure 30C engage respective channel regions of fins 20A-20D, such that current can flow between respective source/drain regions of fins 20A-20D during operation. In furtherance of the depicted embodiment, gate structure 30B and gate structure 30C are active gate structures, whereas gate structure 30A and gate structure 30D-30G are dummy gate structures. “Active gate structure” generally refers to an electrically functional gate structure of FinFET device 10, whereas “dummy gate structure” generally refers to an electrically non-functional gate structure of FinFET device 10. In some implementations, a dummy gate structure mimics physical properties of an active gate structure, such as physical dimensions of the active gate structure, yet is electrically inoperable (in other words, does not enable current to flow between source/drain regions) in FinFET device 10. In FIGS. 1A-1D, gate structure 30A and gate structures 30D-30G wrap portions of fins 20A-20H, positioned such that the gate structure 30A and gate structures 30D-30G interpose respective source/drain regions of fins 20A-20H. In some implementations, gate structure 30A and gate structures 30D-30G enable a substantially uniform processing environment, for example, enabling uniform epitaxial material growth in source/drain regions of fins 20A-20H (for example, when forming epitaxial source/drain features), uniform etch rates in source/drain regions of fins 20A-20H (for example, when forming source/drain recesses), and/or uniform, substantially planar surfaces (for example, by reducing (or preventing) CMP-induced dishing effects).

Gate structures 30A-30G include gate stacks configured to achieve desired functionality according to design requirements of FinFET device 10, such that gate structures 30A-30G include the same or different layers and/or materials. In the depicted embodiment, gate structures 30A-30G have gate stacks that include a gate dielectric 32, a gate electrode 34, and a hard mask layer 36. Gate dielectric 32 is conformally disposed over fins 20A-20H and isolation feature 22, such that gate dielectric 32 has a substantially uniform thickness. In the depicted embodiment, gate dielectric 32 is disposed on sidewall surfaces and bottom surfaces of FinFET device 10 defining gate structures 30A-30G. Gate dielectric 32 includes a dielectric material, such as silicon oxide, high-k dielectric material, other suitable dielectric material, or combinations thereof. In the depicted embodiment, gate dielectric 32 includes a high-k dielectric material (and thus may be referred to as a high-k dielectric layer), such as hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide ($k \approx 3.9$). In some implementations, gate dielectric 32 further includes an interfacial layer (including a dielectric material, such as silicon oxide) disposed between the high-k dielectric layer and fins 20A-20H and isolation feature 22. Gate electrode 34 is disposed over gate dielectric 32. Gate electrode 34 includes an electrically conductive material. In some implementations, gate electrode 34 includes multiple layers, such as a capping layer, a work function layer, a glue/barrier layer, and a metal fill (or bulk) layer. The capping layer can include a material that prevents or eliminates diffusion and/or reaction of constituents between gate dielectric 32 and other layers of gate structures 30A-30G (in particular, gate layers including metal). In some implementation, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. The work function layer can include a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. The glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. The metal fill layer can include a suitable conductive material, such as Al, W, and/or Cu. Gate dielectric 32 and/or gate electrode 34 may include numerous other layers, for example, capping layers, interface layers, diffusion layers, barrier layers, hard mask layers, or combinations thereof. Hard mask layer 36 includes any suitable material, such as silicon and nitrogen (for example, silicon nitride). In some implementations, since gate structures 30A-30D span P-type FinFET 18A and N-type FinFET 18B and gate structures 30E-30G span n-type well strap 19A and p-type well strap 19B, gate structures 30A-30D may have different layers in regions corresponding with P-type FinFET 18A and N-type FinFET 18B, and gate structures 30E-30G may have different layers in regions corresponding with n-type well strap 19A and p-type well strap 19B.

Gate stacks of gate structures 30A-30G are fabricated according to a gate last process, a gate first process, or a hybrid gate last/gate first process. In gate last process implementations, one or more of gate structures 30A-30G include dummy gate stacks that are subsequently replaced with metal gate stacks. The dummy gate stacks include, for example, an interfacial layer (including, for example, silicon oxide) and a dummy gate electrode layer (including, for example, polysilicon). In such implementations, the dummy gate electrode layer is removed to form openings (trenches) in which gate dielectric 32 and/or gate electrode 34 are subsequently formed. In some implementations, a dummy gate stack of at least one of gate structures 30A-30G is replaced with a metal gate stack, while a dummy gate stack of at least one of gate structures 30A-30G remains. Gate last processes and/or gate first processes can implement deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, e-beam writing, or ion-beam writing. The etching processes include dry etching processes, wet etching processes, other etching processes, or combinations thereof.

Gate structures 30A-30G further include respective gate spacers 38 disposed adjacent to (for example, along sidewalls of) the respective gate stacks. Gate spacers 38 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 12 and subsequently anisotropically etched to form gate spacers 38. In some implementations, gate spacers 38 include a multi-layer structure, such as a first dielectric layer that includes silicon nitride and a second dielectric layer that includes silicon oxide. In some implementations, gate spacers 38 include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over substrate 12 and subsequently anisotropically etched to form a first spacer set adjacent to the gate stacks, and a second dielectric layer including silicon and nitrogen can be deposited over substrate 12 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in fins 20A-20H (both of which are not shown in FIGS. 1A-1D) before and/or after forming gate spacers 38.

Epitaxial source features and epitaxial drain features (referred to as epitaxial source/drain features) are disposed over the source/drain regions of fins 20A-20H. For example, semiconductor material is epitaxially grown on fins 20A-20H, forming epitaxial source/drain features 40A-40D. In some implementations, epitaxial source/drain features 40A-40D are formed over the source/drain regions of fins 20A-20H after a fin recess process (for example, an etch back process), such that epitaxial source/drain features 40A-40D are grown from recessed fins 20A-20H. In some implementations, epitaxial source/drain features 40A-40D wrap the source/drain regions of fins 20A-20H. In such implementations, fins 20A-20H may not be subjected to a fin recess process. In FIG. 1C and FIG. 1D, epitaxial source/drain features 40A-40D extend (grow) laterally along the x-direction (in some implementations, substantially perpendicular to fins 20A-20H), such that epitaxial source/drain features 40A-40D are merged epitaxial source/drain features that span more than one fin. For example, epitaxial source/drain feature 40A spans fins 20A, 20B; epitaxial source/drain feature 40B spans fins 20C, 20D; epitaxial source/drain feature 40C spans fins 20E, 20F; and epitaxial source/drain feature 40D spans fins 20G, 20H. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 12. Epitaxial source/drain features 40A-40D are doped with n-type dopants and/or p-type dopants. P-type FinFET 18A and n-type well strap 19A have oppositely doped epitaxial source/drain features, and N-type FinFET 18B and p-type well strap 19B have oppositely doped epitaxial source/drain features. In the depicted embodiment, P-type FinFET 18A and p-type well strap 19B include a p-type dopant, and N-type FinFET 18B and n-type well strap 19A include an n-type dopant. For example, for P-type FinFET 18A (having a p-channel) and p-type well strap 19B, epitaxial source/drain features 40A, 40D are epitaxial layers including silicon and/or germanium, where the silicon germanium containing epitaxial layers are doped with boron, carbon, other p-type dopant, or combinations thereof (for example, forming a Si:Ge:B epitaxial layer or a Si:Ge:C epitaxial layer). In furtherance of the example, for N-type FinFET 18B (having an n-channel) and n-type well strap 19A, epitaxial source/drain features 40B, 40C are epitaxial layers including silicon and/or carbon, where silicon-containing epitaxial layers or silicon-carbon-containing epitaxial layers are doped with phosphorous, arsenic, other n-type dopant, or combinations thereof (for example, forming a Si:P epitaxial layer, a Si:C epitaxial layer, or a Si:C:P epitaxial layer). It is noted that, in FIG. 1A, epitaxial source/drain features 40A-40D are depicted as oxide definition (OD) regions, such epitaxial source/drain features 40A, 40D can alternatively be referred to as P+ OD regions and epitaxial source/drain features 40B, 40C can alternatively be referred to as N+ OD regions. In some implementations, epitaxial source/drain features 40A-40D include materials and/or dopants that achieve desired tensile stress and/or compressive stress in the channel region. In some implementations, epitaxial source/drain features 40A-40D are doped during deposition by adding impurities to a source material of the epitaxy process. In some implementations, epitaxial source/drain features 40A-40D are doped by an ion implantation process subsequent to a deposition process. In some implementations, annealing processes are performed to activate dopants in epitaxial source/drain features 40A-40D and/or other source/drain regions of FinFET device 10, such as HDD regions and/or LDD regions.

In some implementations, silicide layers are formed on epitaxial source/drain features 40A-40D. In some implementations, silicide layers 42A-42D are formed by depositing a metal layer over epitaxial source/drain features 40A-40D. The metal layer includes any material suitable for promoting silicide formation, such as nickel, platinum, palladium, vanadium, titanium, cobalt, tantalum, ytterbium, zirconium, other suitable metal, or combinations thereof. Integrated circuit device 10 is then heated (for example, subjected to an annealing process) to cause constituents of epitaxial source/drain features 40A-40D (for example, silicon and/or germanium) to react with the metal. The silicide layers thus include metal and a constituent of epitaxial source/drain features 40A-40D (for example, silicon and/or germanium). In some implementations, the silicide layers include nickel silicide, titanium silicide, or cobalt silicide. Any un-reacted metal, such as remaining portions of the metal layer, is selectively removed by any suitable process, such as an etching process. In some implementations, the silicide layers and epitaxial source/drain features 40A-40D are collectively referred to as the epitaxial source/drain features of integrated circuit device 10.

A multilayer interconnect (MLI) feature 50 is disposed over substrate 12. MLI feature 50 electrically couples various devices (for example, transistors, resistors, capacitors, and/or inductors) and/or components (for example, gate structures and/or source/drain features) of FinFET device 10, such that the various devices and/or components can operate as specified by design requirements of FinFET device 10. MLI feature 50 includes a combination of dielectric layers and electrically conductive layers (for example, metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature 50. During operation of FinFET device 10, the interconnect features are configured to route signals between the devices and/or the components of FinFET device 10 and/or distribute signals (for example, clock signals, voltage signals, and/or ground signals) to the devices and/or the components of FinFET device 10. It is noted that though MLI feature 50 is depicted with a given number of dielectric layers and conductive layers, the present disclosure contemplates MLI feature 50 having more or less dielectric layers and/or conductive layers.

MLI feature 50 includes one or more dielectric layers, such as an interlayer dielectric layer 52 (ILD-0) disposed over substrate 12, an interlayer dielectric layer 54 (ILD-1) disposed over ILD layer 52, an interlayer dielectric layer 56 (ILD-2) disposed over ILD layer 54, and an interlayer dielectric layer 58 (ILD-3) disposed over ILD layer 56. ILD layers 52-58 include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK® (Dow Chemical, Midland, Mich.), polyimide, other low-k dielectric material, or combinations thereof. In the depicted embodiment, ILD layers 52-58 are dielectric layers that include a low-k dielectric material (generally referred to as low-k dielectric layers). In some implementations, low-k dielectric material generally refers to materials having a dielectric constant (k) that is less than 3. ILD layers 52-58 can include a multilayer structure having multiple dielectric materials. MLI feature 50 can further include one or more contact etch stop layers (CESLs) disposed between ILD layers 52-58, such as a CESL disposed between ILD layer 52 and ILD layer 54, a CESL disposed between ILD layer 54 and ILD layer 56, and a CESL disposed between ILD layer 56 and ILD layer 58. In some implementations, a CESL is disposed between substrate 12 and/or isolation feature 22 and ILD layer 52. CESLs include a material different than ILD layers 52-58, such as a dielectric material that is different than the dielectric material of ILD layers 52-58. For example, where ILD layers 52-58 include a low-k dielectric material, CESLs include silicon and nitrogen, such as silicon nitride or silicon oxynitride. ILD layers 52-58 are formed over substrate 12 by a deposition process, such as CVD, PVD, ALD, HDPCVD, MOCVD, RPCVD, PECVD, LPCVD, ALCVD, APCVD, plating, other suitable methods, or combinations thereof. In some implementations, ILD layers 52-58 are formed by a flowable CVD (FCVD) process that includes, for example, depositing a flowable material (such as a liquid compound) over substrate 12 and converting the flowable material to a solid material by a suitable technique, such as thermal annealing and/or ultraviolet radiation treating. Subsequent to the deposition of ILD layers 52-58, a CMP process and/or other planarization process is performed, such that ILD layers 52-58 have substantially planar surfaces.

Device-level contacts 60A-60J, vias 70A-70I, and conductive lines 80A-80G (collectively referred to as a metal one (M1) layer of MLI feature 50) are disposed in ILD layers 52-58 to form interconnect structures. Device-level contacts 60A-60J, vias 70A-70I, and conductive lines 80A-80G include any suitable electrically conductive material, such as Ta, Ti, Al, Cu, Co, W, TiN, TaN, other suitable conductive materials, or combinations thereof. Various conductive materials can be combined to provide device-level contacts 60A-60J, vias 70A-70I, and/or conductive lines 80A-80G with various layers, such as a barrier layer, an adhesion layer, a liner layer, a bulk layer, other suitable layer, or combinations thereof. In some implementations, device-level-contacts 60A-60J include Ti, TiN, and/or Co; vias 70A-70I include Ti, TiN, and/or W; and conductive lines 80A-80G include Cu, Co, and/or Ru. Device-level contacts 60A-60J, vias 70A-70I, and conductive lines 80A-80G are formed by patterning ILD layers 52-58. Patterning ILD layers 52-58 can include lithography processes and/or etching processes to form openings (trenches), such as contact openings, via openings, and/or line openings in respective ILD layers 52-58. In some implementations, the lithography processes include forming a resist layer over respective ILD layers 52-58, exposing the resist layer to patterned radiation, and developing the exposed resist layer, thereby forming a patterned resist layer that can be used as a masking element for etching opening(s) in respective ILD layers 52-58. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of ILD layers 52-58, device-level contacts 60A-60J, vias 70A-70I, and/or conductive lines 80A-80G.

Device-level contacts 60A-60J (also referred to as local interconnects or local contacts) electrically couple and/or physically couple IC device features, such as features of P-type FinFET 18A, N-type FinFET 18B, n-type well strap 19A, and p-type well strap 19B to vias 70A-70I of MLI feature 50. For example, device-level contacts 60A-60J are metal-to-device (MD) contacts, which generally refer to contacts to a conductive region, such as source/drain regions, of FinFET device 10. In the depicted embodiment, device-level contact 60A and device-level contact 60B are disposed on respective epitaxial source/drain features 40A, such that device-level contacts 60A, 60B physically (or directly) connect the source/drain regions of P-type FinFET 18A respectively to via 70A and via 70B; and device-level contact 60D and device-level contact 60E are disposed on respective epitaxial source/drain features 40B, such that device-level contacts 60D, 60E physically (or directly) connect the source/drain regions of N-type FinFET 18B respectively to via 70C and via 70D. In furtherance of the depicted embodiment, device-level contact 60G and device-level contact 60H are disposed on respective on epitaxial source/drain features 40C, such that device-level contacts 60G, 60H physically (or directly) connect the source/drain regions of n-type well strap 19A respectively to via 70F and via 70G; and device-level contact 60I and device-level contact 60J are disposed on respective on epitaxial source/drain features 40D, such that device-level contacts 60I, 60J physically (or directly) connect the source/drain regions of p-type well strap 19B respectively to via 70H and via 70I. In yet furtherance of the depicted embodiment, device-level contact 60C is disposed on a respective epitaxial source/drain feature 40A and device-level contact 60F is disposed on a respective epitaxial source/drain feature 40B, yet device-level contacts 60C, 60F do not further connect the source/drain regions respectively of P-type FinFET 18A and N-type FinFET 18B to another electrically conductive feature of MLI feature 50. In some implementations, device-level contacts 60C, 60F are dummy contacts, which have physical properties similar to device-level contacts 60A, 60B, 60D, and 60E to enable a substantially uniform processing environment. Device-level contacts 60A-60J extend through ILD layer 52 and/or ILD layer 54, though the present disclosure contemplates embodiments where device-level contacts 60A-60J extend through more or less ILD layers and/or CESLs of MLI feature 50.

Vias 70A-70I electrically couple and/or physically couple conductive features of MLI feature 50 to one another. In the depicted embodiment, via 70A is disposed on device-level contact 60A, such that via 70A physically (or directly) connects device-level contact 60A to conductive line 80A; via 70B is disposed on device-level contact 60B, such that via 70B physically (or directly) connects device-level contact 60B to conductive line 80B; via 70C is disposed on device-level contact 60D, such that via 70C physically (or directly) connects device-level contact 60D to conductive line 80E; and via 70D is disposed on device-level contact 60E, such that via 70D physically (or directly) connects device-level contact 60E to conductive line 80D. Vias 70A, 70B electrically couple source/drain regions of P-type FinFET 18A to conductive lines 80A, 80B (one of which is electrically connected to a power supply voltage $V_{DD}$ (in some implementations, configured as a positive supply voltage depending on design requirements)), and vias 70C, 70D electrically couple source/drain regions of N-type FinFET 18B to conductive lines 80D, 80E (one of which is electrically connected to a power supply voltage $V_{SS}$ (in some implementations, configured as ground and/or a negative supply voltage). In furtherance of the depicted embodiment, via 70F is disposed on device-level contact 60G, such that via 70F physically (or directly) connects device-level contact 60G to conductive line 80F; via 70G is disposed on device-level contact 60H, such that via 70G physically (or directly) connects device-level contact 60G to conductive line 80F; via 70H is disposed on device-level contact 60I, such that via 70H physically (or directly) connects device-level contact 60I to conductive line 80G; and via 70I is disposed on device-level contact 60J, such that via 70I physically (or directly) connects device-level contact 60J to conductive line 80G. Vias 70F, 70G electrically couple source/drain regions of n-type well strap 19A to conductive line 80F (which is electrically connected to power supply voltage $V_{DD}$), and vias 70H, 70I electrically couple source/drain regions of p-type well strap 19B to conductive line 80G (which is electrically connected to power supply voltage $V_{SS}$). Vias 70A-70D and vias 70E-70I extend through ILD layer 54, though the present disclosure contemplates embodiments where vias 70A-70D and vias 70E-70I extend through more or less ILD layers and/or CESLs of MLI feature 50. In some implementations, MLI feature 50 further includes vias that interconnect conductive lines 80A-80G (in other words, the M1 layer) to conductive lines disposed in other ILD layers (such as a metal two (M2) layer of MLI feature 50, not shown) overlying ILD layers 52-58, thereby electrically and/or physically coupling the M1 layer to the M2 layer.

Via 70E that electrically couples and/or physically couples an IC device feature to a conductive feature of MLI feature 50. In FIG. 1A, via 70E is disposed on gate structure 30B, such that via 70E physically (or directly) connects gate structure 30B to conductive line 80C. Via 70E extends through ILD layer 52, ILD layer 54, and ILD layer 56, though the present disclosure contemplates embodiments where via 70E extends through more or less ILD layers and/or CESLs of MLI feature 50. In such implementations, via 70E is physically and electrically coupled with gate structure 30B. In alternative implementations, MLI feature 50 further includes a device-level contact that electrically couples and/or physically couples gate structure 30B to via 70E. For example, the device-level contact is disposed on gate structure 30B, such that the device-level contact physically (or directly) connects gate structure 30B to via 70E, and via 70E physically (or directly) connects the device-level contact to conductive line 80C. Such device-level contact is thus referred to as a gate contact (CG) or metal-to-poly (MP) contact, which generally refers to a contact to a gate structure, such as a poly gate structure or a metal gate structure. In such implementations, the device-level contact extends through ILD layer 52 and ILD layer 54, and via 70E extends through ILD layer 56, though the present disclosure contemplates embodiments where the device-level contact and/or via 70E extend through more or less ILD layers and/or CESLs of MLI feature 50.

Figure 2:
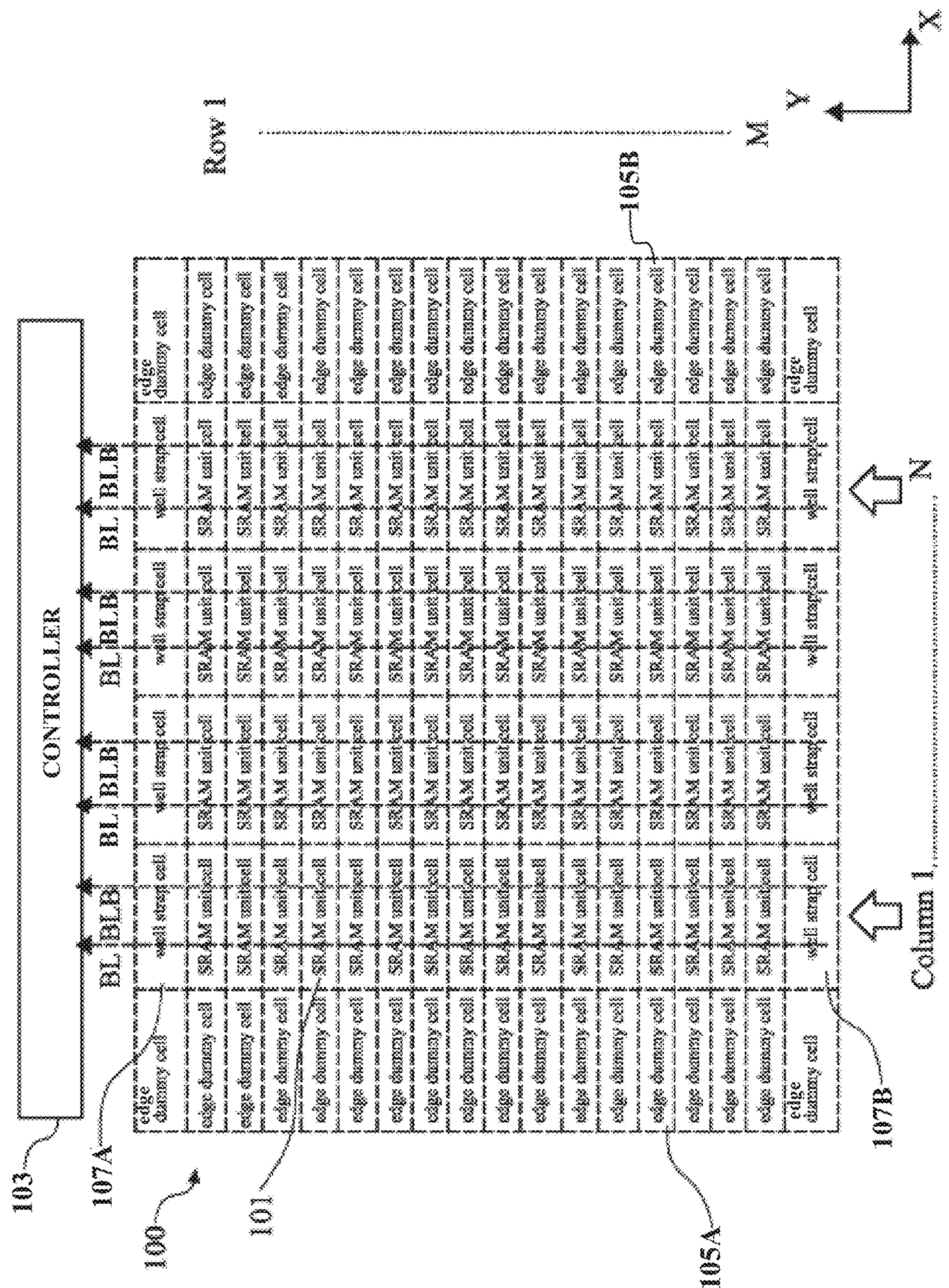
FIG. 2 is a diagrammatic plan view of a memory array, which can implement well straps configured as described herein, according to various aspects of the present disclosure.

Well straps, such as n-type well strap 19A and p-type well strap 19B, can be implemented in memory arrays to improve performance. FIG. 2 is a diagrammatic plan view of a memory array 100, which can implement well straps configured as described herein, according to various aspects of the present disclosure. In the depicted embodiment, memory array 100 is a static random access memory (SRAM) array. However, the present disclosure contemplates embodiments, where memory array 100 is another type of memory, such as a dynamic random access memory (DRAM), a non-volatile random access memory (NVRAM), a flash memory, or other suitable memory. Memory array 100 may be included in a microprocessor, a memory, and/or other IC device. In some implementations, memory array 100 may be a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIG. 2 has been simplified for the sake of clarity to better understand the inventive concepts of the present disclosure. Additional features can be added in memory array 100, and some of the features described below can be replaced, modified, or eliminated in other embodiments of memory array 100.

Memory array 100 includes memory cells 101, such as SRAM memory cells, configured to store data. In some implementations, memory cells 101 include various p-type FinFETs and/or n-type FinFETs. Memory cells 101 are arranged in column 1 to column N extending along a first direction (here, in a y-direction) and row 1 to row M extending along a second direction (here, in an x-direction), where N and M are positive integers. Column 1 to column N each include a bit line pair extending along the first direction, such as a bit line (BL) and a bit line bar (BLB) (also referred to as a complementary bit line), that facilitate reading data from and/or writing data to respective memory cells 101 in true form and complementary form on a column-by-column basis. Row 1 to row M each includes a word line (WL) (not shown) that facilitates access to respective memory cells 101 on a row-by-row basis. Each memory cell 101 is electrically connected to a respective BL, a respective BLB, and a respective WL, which are electrically connected to a controller 103. Controller 103 is configured to generate one or more signals to select at least one WL and at least one bit line pair (here, BL and BLB) to access at least one of memory cells 101 for read operations and/or write operations. Controller 103 includes any circuitry suitable to facilitate read/write operations from/to memory cells 101, including but not limited to, a column decoder circuit, a row decoder circuit, a column selection circuit, a row selection circuit, a read/write circuit (for example, configured to read data from and/or write data to memory cells 101 corresponding to a selected bit line pair (in other words, a selected column)), other suitable circuit, or combinations thereof. In some implementations, the controller 103 includes at least one sense amplifier configured to detect and/or amplify a voltage differential of a selected bit line pair. In some implementations, the sense amplifier is configured to latch or otherwise store data values of the voltage differential.

A perimeter of memory array 100 is configured with dummy cells, such as edge dummy cells and well strap cells, to ensure uniformity in performance of memory cells 101. Dummy cells are configured physically and/or structurally similar to memory cells 101, but do not store data. For example, dummy cells can include p-type wells, n-type wells, fin structures (including one or more fins), gate structures, source/drain features, and/or contact features. Well strap cells generally refer to dummy cells that are configured to electrically couple a voltage to an n-type well of memory cells 101, a p-type well of memory cells 101, or both. In the depicted embodiment, row 1 to row M each begin with an edge dummy cell 105A and end with an edge dummy cell 105B, such that row 1 to row M of memory cells 101 are disposed between edge dummy cells 105A and edge dummy cells 105B. Edge dummy cells 105A and edge dummy cells 105B are arranged in respective columns extending along the first direction (here, the y-direction). In some implementations, the column of edge dummy cells 105A and/or the column of edge dummy cells 105B are substantially parallel to at least one bit line pair (here, BL and BLB) of memory array 100. In some implementations, edge dummy cells 105A and/or edge dummy cells 105B are configured to connect respective memory cells 101 to respective WLs. In some implementations, edge dummy cells 105A and/or edge dummy cells 105B include circuitry for driving WLs. In some implementations, edge dummy cells 105A and/or edge dummy cells 105B are electrically connected to a power supply voltage $V_{DD}$ (for example, a positive power supply voltage) and/or a power supply voltage $V_{SS}$ (for example, an electrical ground) depending on design requirements of memory array 100.

In furtherance of the depicted embodiment, column 1 to column N each begin with a well strap cell 107A and end with a well strap cell 107B, such that column 1 to column N of memory cells 101 are disposed between well strap cells 107A and well strap cells 107B. Well strap cells 107A and well strap cells 107B are arranged in respective rows extending along the second direction (here, the x-direction). In some implementations, the row of well strap cells 107A and the row of well strap cells 107B are substantially parallel to at least one WL of memory array 100. Well strap cells 107A are disposed between one of edge dummy cells 105A and one of edge dummy cells 105B, and well strap cells 107B are disposed between one of edge dummy cells 105A and one of edge dummy cells 105B. In the depicted embodiment, well strap cells 107A and/or well strap cells 107B include an n-type well strap, a p-type well strap, or both an n-type well strap and a p-type well strap. In some implementations, well strap cells 107A and/or well strap cells 107B include an n-type well strap region having one or more n-type well straps disposed adjacent to a p-type well strap region having one or more p-type well straps. The n-type well strap region and the p-type well strap region may be disposed between dummy regions of the well strap cells 107A and/or the well strap cells 107B.

In some implementations, the n-type well strap is configured as n-type well strap 19A described above. For example, an n-type well strap of well strap cells 107A and/or well strap cells 107B is configured to electrically couple an n-type well that corresponds with at least one p-type FinFET of memory cells 101 to a voltage source (for example, $V_{DD}$), where a dopant concentration of a fin structure of the n-type well strap is greater than a dopant concentration of a fin structure of the at least one p-type FinFET. In some implementations, the p-type FinFET includes a fin doped with an n-type dopant of a first dopant concentration, and the n-type well strap includes a fin doped with the n-type dopant of a second dopant concentration, where the second dopant concentration is at least three times greater than the first dopant concentration. In some implementations, the n-well region has a third dopant concentration of the n-type dopant, where the third dopant concentration is greater than the first dopant concentration. In some implementations, the fins of the p-type FinFET and the n-type well strap have source/drain features doped with different type dopants. For example, the p-type FinFET includes source/drain features doped with a p-type dopant and the n-type well strap includes source/drain features doped with an n-type dopant.

In some implementations, the n-type well strap is configured as p-type well strap 19B described above. For example, a p-type well strap of well strap cells 107A and/or well strap cells 107B is configured to electrically couple a p-type well that corresponds with at least one n-type FinFET of memory cells 101 to a voltage source (for example, $V_{SS}$), where a dopant concentration of a fin structure of the p-type well strap is greater than a dopant concentration of a fin structure of the at least one n-type FinFET. In some implementations, the n-type FinFET includes a fin doped with a p-type dopant of a first dopant concentration, and the p-type well strap includes a fin doped with the p-type dopant of a second dopant concentration, where the second dopant concentration is at least three times greater than the first dopant concentration. In some implementations, the p-well has a third dopant concentration of the p-type dopant, where the third dopant concentration is greater than the first dopant concentration. In some implementations, the fins of the n-type FinFET and the p-type well strap have source/drain features doped with different type dopants. For example, the n-type FinFET includes source/drain features doped with an n-type dopant, and the p-type well strap includes source/drain features doped with a p-type dopant.

Figure 3:
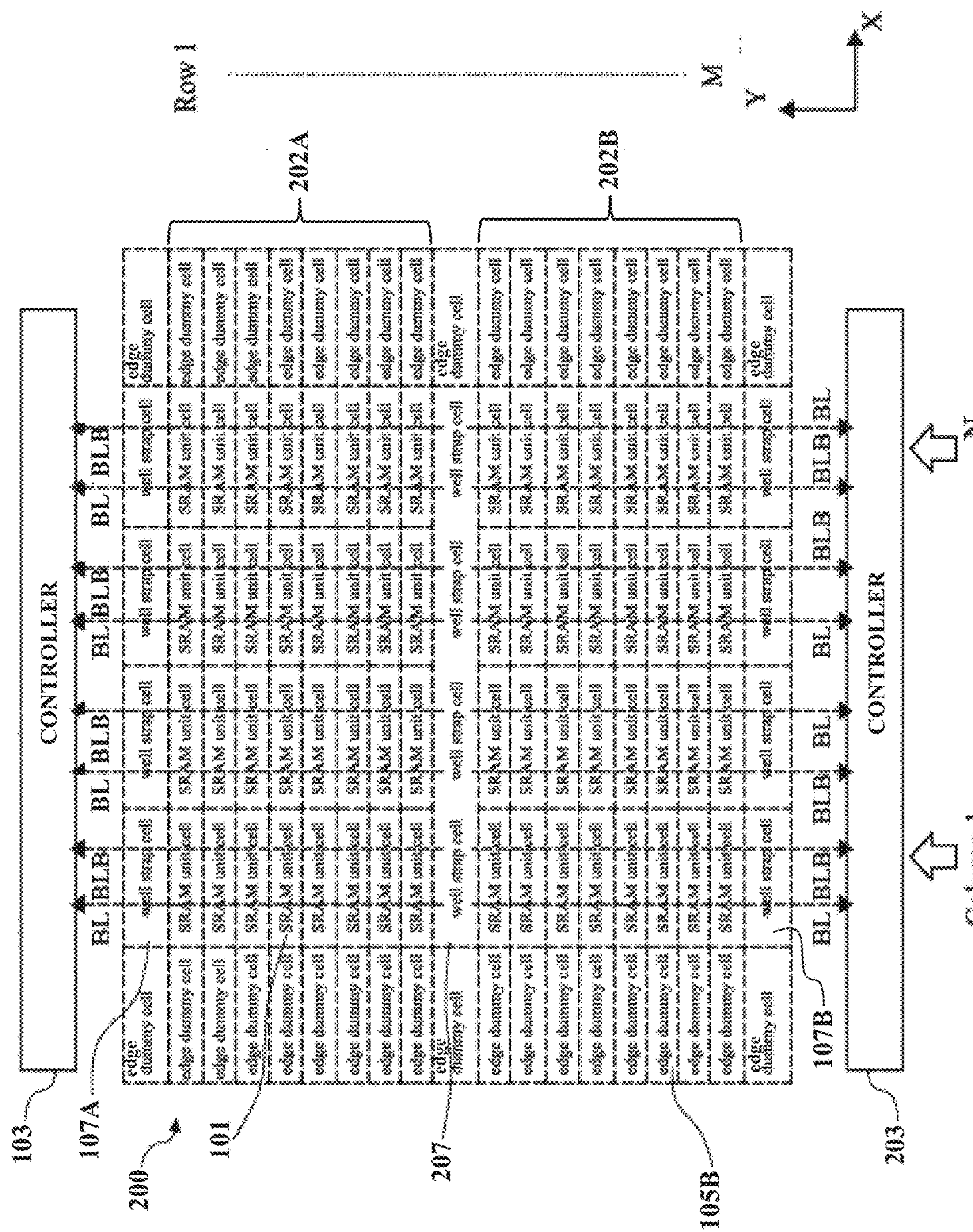
FIG. 3 is a diagrammatic plan view of another memory array, which can implement well straps configured as described herein, according to various aspects of the present disclosure.

FIG. 3 is a diagrammatic plan view of a memory array 200, such as a SRAM array, which can implement well straps configured as described herein, according to various aspects of the present disclosure. Memory array 200 is similar in many respects to memory array 100. For example, in the depicted embodiment, memory array 200 is a SRAM array. Accordingly, similar features in FIG. 3 and FIG. 2 are identified by the same reference numerals for clarity and simplicity. Memory array 200 may be included in a microprocessor, a memory, and/or other IC device. In some implementations, memory array 200 may be a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIG. 3 has been simplified for the sake of clarity to better understand the inventive concepts of the present disclosure. Additional features can be added in memory array 200, and some of the features described below can be replaced, modified, or eliminated in other embodiments of memory array 200.

In FIG. 3, memory array 200 includes memory cells 101, controller 103, edge dummy cells 105A, edge dummy cells 105B, well strap cells 107A, and well strap cells 107B. In contrast to memory array 100, memory array 200 divides memory cells 101 into a memory array 202A and a memory array 202B (which can be referred to as sub-arrays). Further, each bit line pair is broken into a bit line pair for memory array 202A and a bit line pair for memory array 202B, such that column 1 to column N each have two bit line pairs, not a continuous bit line pair. Memory array 200 further includes a controller 203, where BLs, BLBs, and WLs for memory array 202A are electrically connected to controller 103, while BLs, BLBs, and WLs for memory array 202B are electrically connected to controller 203. Controller 203 is similar to controller 103. Accordingly, each memory cell 101 of memory array 202A is electrically connected to a respective BL, a respective BLB, and a respective WL, which are electrically connected to controller 103, and each memory cell 101 in memory array 202B is electrically connected to a respective BL, a respective BLB, and a respective WL, which are electrically connected to controller 203.

Memory array 200 further includes a row of well strap cells 307 extending along the second direction (here, the x-direction), where the row of well strap cells 307 is disposed between memory array 202A and memory array 202B. Memory cells 101 in memory array 202A are disposed between well strap cells 107A and well strap cells 207, and memory cells 101 in memory array 202B are disposed between well strap cells 207 and well strap cells 107B. Column 1 to column N of memory cells 101 in memory array 202A thus each begin with one of well strap cells 107A and end with one of well strap cells 207, and column 1 to column N of memory cells 101 in memory array 202B thus each begin with one of well strap cells 207 and end with one of well strap cells 107B. In furtherance of the depicted embodiment, the row of well strap cells 307 is also disposed between one of edge dummy cells 105A and one of edge dummy cells 105B. In some implementations, the row of well strap cells 207 is substantially parallel to at least one WL of memory array 200.

Well strap cells 207 are similar to well strap cells 107A and/or well strap cells 107B. For example, well strap cells 207 include an n-type well strap, a p-type well strap, or both an n-type well strap and a p-type well strap. In some implementations, well strap cells 207 include an n-type well strap region having one or more n-type well straps that is adjacent to a p-type well strap region having one or more p-type well straps. The n-type well strap region and the p-type well strap region may be disposed between dummy regions. In some implementations, the n-type well strap is configured as n-type well strap 19A described above. For example, an n-type well strap of well strap cells 207 is configured to electrically couple an n-type well that corresponds with at least one p-type FinFET of memory cells 101 to a voltage source (for example, $V_{DD}$), where a dopant concentration of a fin structure of the n-type well strap is greater than a dopant concentration of a fin structure of the at least one p-type FinFET. In some implementations, the dopant concentration of the fin structure of the n-type well strap is at least three times greater than the dopant concentration of the fin structure of the at least one p-type FinFET. In some implementations, the fin structures of the n-type well strap and the p-type FinFET have oppositely doped source/drain features (or OD regions). In some implementations, the p-type well strap is configured as p-type well strap 19B described above. For example, a p-type well strap of well strap cells 207 is configured to electrically couple a p-type well that corresponds with at least one n-type FinFET of memory cells 101 to a voltage source (for example, $V_{SS}$), where a dopant concentration of a fin structure of the p-type well strap is greater than a dopant concentration of a fin structure of the at least one n-type FinFET. In some implementations, the dopant concentration of the fin structure of the p-type well strap is at least three times greater than the dopant concentration of the fin structure of the at least one n-type FinFET. In some implementations, the fin structures of the p-type well strap and the n-type FinFET have oppositely doped source/drain features (or OD regions).

Figure 4A:
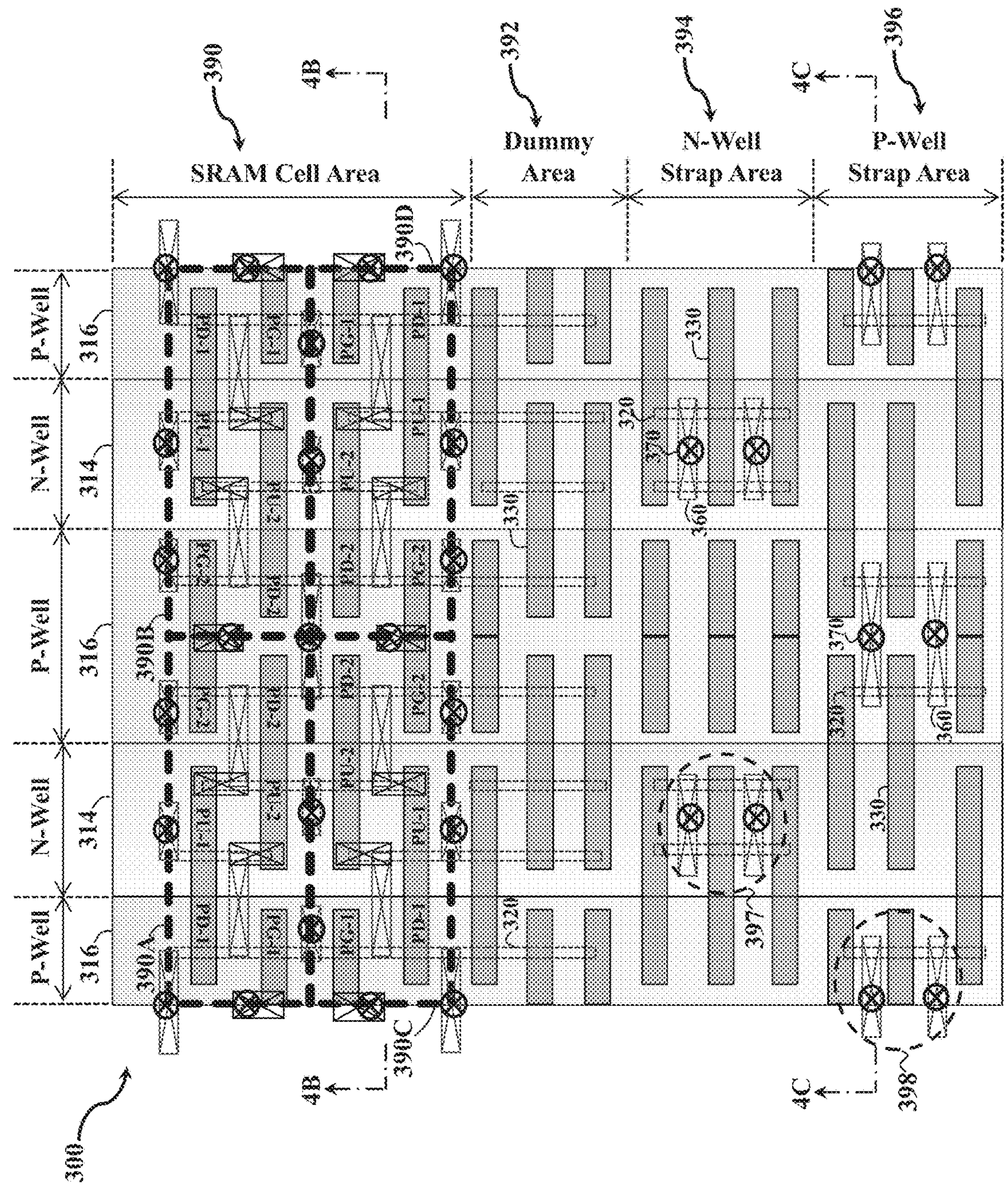
FIGS. 4A-4C are fragmentary diagrammatic views of a portion of a memory array according to various aspects of the present disclosure.
Figure 4B:
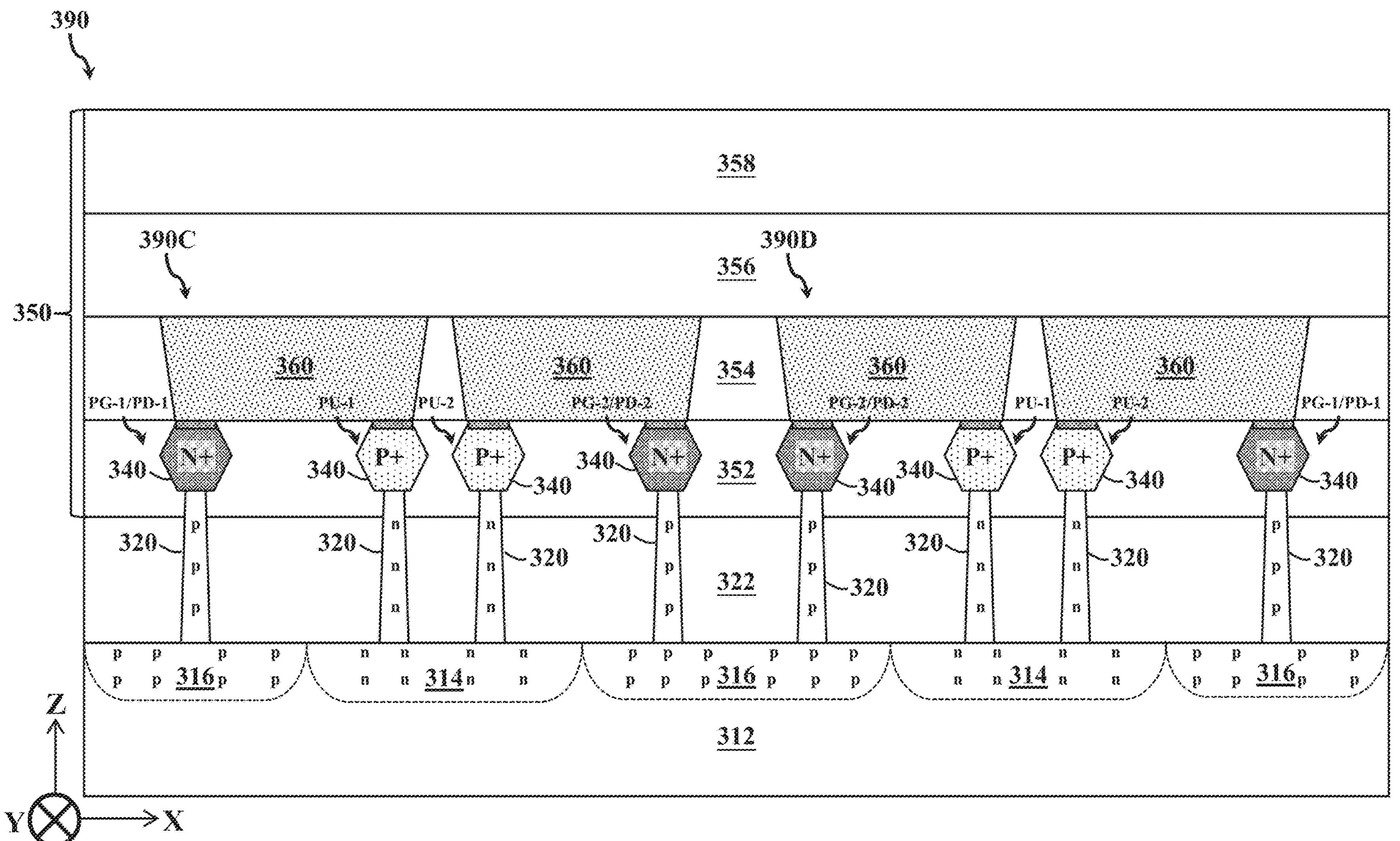
Figure 4C:
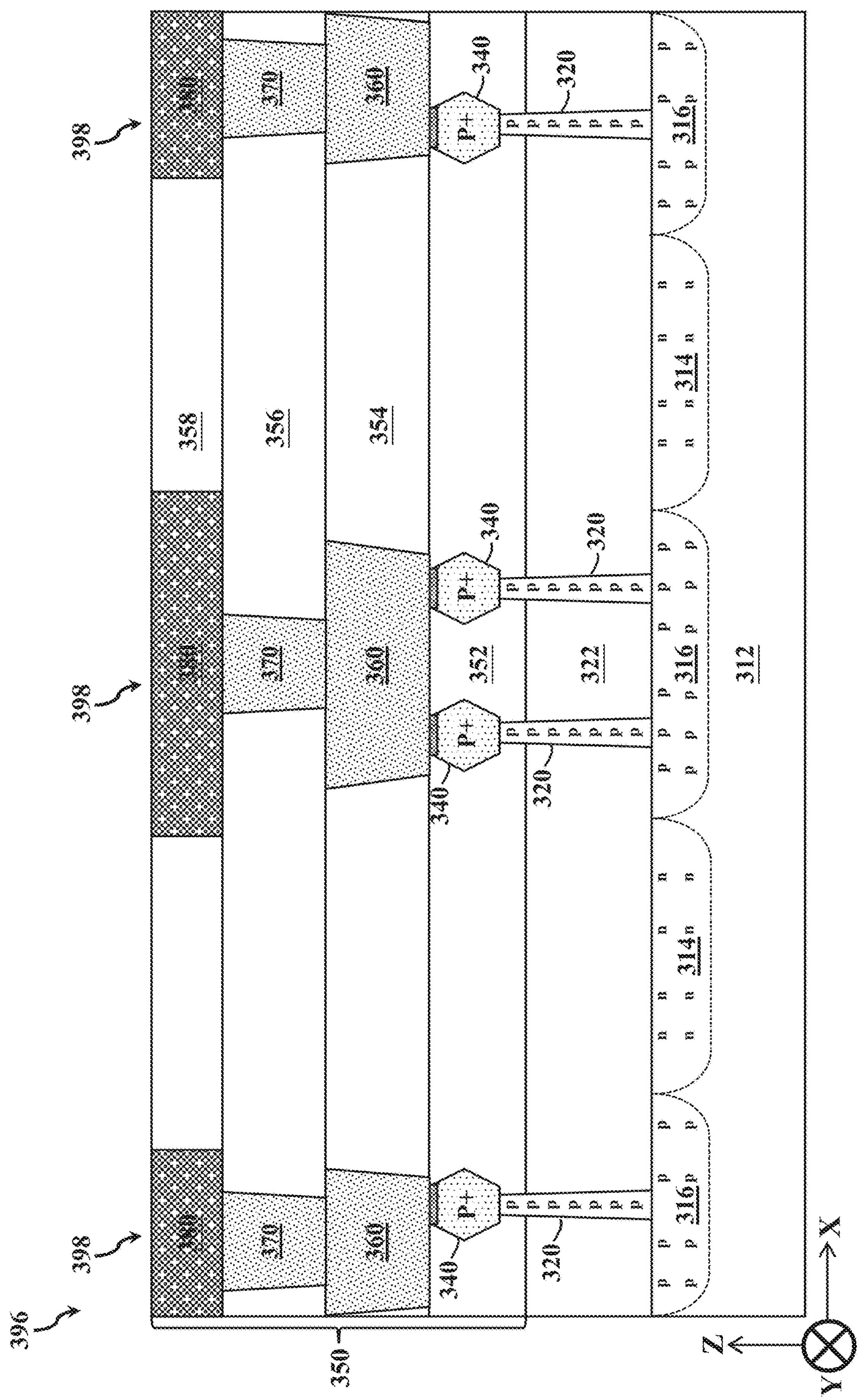

FIGS. 4A-4C are fragmentary diagrammatic views of a portion of a SRAM array 300 according to various aspects of the present disclosure. In particular, FIG. 4A is a fragmentary top view of a portion of SRAM array 300 (for example, in an x-y plane); FIG. 4B is a diagrammatic cross-sectional view of the portion of SRAM array 300 along line 4B-4B of FIG. 4A (for example, in an x-z plane); and FIG. 4C is a diagrammatic cross-sectional view of the portion of SRAM array 300 along line 4C-4C of FIG. 4A (for example, in an x-z plane). In some implementations, the portion of SRAM array 300 represents a portion of memory array 100 or memory array 200. FIGS. 4A-4C have been simplified for the sake of clarity to better understand the inventive concepts of the present disclosure. Additional features can be added in SRAM array 300, and some of the features described below can be replaced, modified, or eliminated in other embodiments of SRAM array 300.

In FIGS. 4A-4C, SRAM array 300 includes a substrate 312 having various doped regions disposed therein, such as n-wells 314 and p-wells 316. Substrate 312, n-wells 314, and p-wells 316 are similar to substrate 12, n-well 14, and p-well 16 described above with reference to FIGS. 1A-1D. SRAM array 300 further includes various features disposed over n-wells 314 and p-wells 316, where the various features are configured to achieve desired functionality. For example, SRAM array 300 includes fins 320 (similar to fins 20A-20H described above with reference to FIGS. 1A-1D), isolation features 322 (similar to isolation feature 22 described above with reference to FIGS. 1A-1D), gate structures 330 (similar to gate structures 30A-30G described above with reference to FIGS. 1A-1D), epitaxial source/drain features 340 (similar to epitaxial source/drain features 40A-40D described above with reference to FIGS. 1A-1D), an MLI feature 350 (similar to MLI feature 50 described above with reference to FIGS. 1A-1D), ILD layers 352-358 (similar to ILD layers 52-58 described above with reference to FIGS. 1A-1D), device-level contacts 360 (similar to device-level contacts 60A-60J described above with reference to FIGS. 1A-1D), vias 370 (similar to vias 70A-70I), and conductive lines 380 (similar to conductive lines 80A-80G described above with reference to FIGS. 1A-1D). For example, in FIG. 4A, the various features are configured to form a SRAM cell area 390, a dummy area 392, a n-well strap area 394, and a p-well strap area 396. In the depicted embodiment, dummy area 392 is disposed between SRAM cell area 390 and a well strap area (here, n-well strap area 394 and p-type well strap area 396). In furtherance of the depicted embodiment, n-well strap area 394 is disposed adjacent to p-type well strap area 396.

SRAM cell area 390 includes a SRAM cell 390A, a SRAM cell 390B, a SRAM cell 390C, and a SRAM cell 390D. SRAM cells 390A-390D include a single port SRAM, a dual-port SRAM, other type SRAM, or combinations thereof. In the depicted embodiment, SRAM cells 390A-390D include single port SRAMs. For example, each of SRAM cells 390A-390D include six transistors: a pass-gate transistor PG-1, a pass-gate transistor PG-2, a pull-up transistor PU-1, a pull-up transistor PU-2, a pull-down transistor PD-1, and a pull-down transistor PD-1. Each of SRAM cells 390A-390D includes one n-type well 314 disposed between two p-type wells 316, where pull-up transistors PU-1, PU-2 are disposed over n-type well 314 and pass-gate transistors PG-1, PG-2 and pull-down transistors PD-1, PD-2 are disposed over p-type wells 316. Pull-up transistors PU-1, PU-2 are p-type FinFETs, pass-gate transistors PG-1, PG-2 are n-type FinFETs, and pull-down transistors PD-1, PD-2 are p-type transistors. In some implementations, pull-up transistors PU-1, PU-2 are configured as p-type FinFET 18A described above with reference to FIGS. 1A-1D, while pass-gate transistors PG-1, PG-2 and pull-down transistors PD-1, PD-2 are configured as n-type FinFET 18B described above with reference to FIGS. 1A-1D. For example, pass-gate transistors PG-1, PG-2 and/or pull-down transistors PD-1, PD-2 each include a fin structure (including one or more fins 320) disposed over p-type well 316 and a respective gate structure 330 disposed over a channel region of the fin structure, such that the gate structure 330 interposes source/drain regions of the fin structure. The fin structures of pass-gate transistors PG-1, PG-2 and/or pull-down transistors PD-1, PD-2 include p-type dopants (p) and are electrically connected to p-type well 316 (FIG. 4B). The fin structures of pass-gate transistors PG-1, PG-2 and/or pull-down transistors PD-1, PD-2 further include n-type epitaxial source/drain features (FIG. 4B) (in other words, epitaxial source/drain features 340 of pass-gate transistors PG-1, PG-2 and/or pull-down transistors PD-1, PD-2 include n-type dopants). Gate structures 330 and/or epitaxial source/drain features 340 of pass-gate transistors PG-1, PG-2 and/or pull-down transistors PD-1, PD-2 are electrically connected to a voltage source (for example, $V_{SS}$) by MLI feature 350 (in particular, respective contacts 360, vias 370, and/or conductive lines 380 disposed in ILD layers 352-358). In furtherance of the example, pull-up transistors PU-1, PU-2 each include a fin structure (including one or more fins 320) disposed over n-type well 314 and a respective gate structure 330 disposed over a channel region of the fin structure, such that the gate structure 330 interposes source/drain regions of the fin structure. The fin structures of pull-up transistors PU-1, PU-2 include n-type dopants (n) and are electrically connected to n-type well 314 (FIG. 4B). The fin structures of pull-up transistors PU-1, PU-2 further include p-type epitaxial source/drain features (FIG. 4B) (in other words, epitaxial source/drain features 340 of pull-up transistors PU-1, PU-2 include p-type dopants). Gate structures 330 and/or epitaxial source/drain features 340 of pull-up transistors PU-1, PU-2 are electrically connected to a voltage source (for example, $V_{DD}$) by MLI feature 350 (in particular, respective contacts 360, vias 370, and/or conductive lines 380 disposed in ILD layers 352-358).

N-well strap area 394 includes fin-based n-well strap structures 397 configured to electrically connect n-type wells 314 to a voltage source (for example, $V_{SS}$). N-well strap structures 397 are structurally similar to pull-up transistors PU-1, PU-2. For example, each n-well strap structure 397 includes a fin structure (including one or more fins 320) disposed over n-type well 314 and a respective gate structure 330 disposed over a channel region of the fin structure, such that the gate structure 330 interposes source/drain regions of the fin structure. The fin structures of the n-well strap structures 397 include n-type dopants and are electrically connected to n-type well 314. In some implementations, a dopant concentration of the fin structures of the n-well strap structures 397 is greater than a dopant concentration of the fin structures of pull-up transistors PU-1, PU-2. In some implementations, the dopant concentration of the fin structures of the n-well strap structures 397 is at least three times greater than a dopant concentration of the fin structures of pull-up transistors PU-1, PU-2. Increasing the dopant concentration of the fin structures of n-well strap structures 398 can reduce pick-up resistance and latch-up in SRAM array 300. Further, in contrast to the fin structures of pull-up transistors PU-1, PU-2, the fin structures of n-well strap structures 397 further include n-type epitaxial source/drain features (in other words, epitaxial source/drain features 340 of n-well strap structures 397 include n-type dopants), which are electrically connected to the voltage source by MLI feature 350 (in particular, respective contacts 360, vias 370, and/or conductive lines 380 disposed in ILD layers 352-358).

P-well strap area 396 includes fin-based p-well strap structures 398 configured to electrically connect p-type wells 316 to a voltage source (for example, $V_{DD}$). P-well strap structures 398 are structurally similar to pass-gate transistors PG-1, PG-2 and/or pull-down transistors PD-1, PD-2. For example, each p-well strap structure 398 includes a fin structure (including one or more fins 320) disposed over p-type well 316 and a respective gate structure 330 disposed over a channel region of the fin structure, such that the gate structure 330 interposes source/drain regions of the fin structure. The fin structures of the p-well strap structures 398 include p-type dopants and are electrically connected to p-type well 316 (FIG. 4C). In some implementations, a dopant concentration of the fin structures of the p-well strap structures 398 is greater than a dopant concentration of the fin structures of pass-gate transistors PG-1, PG-2 and/or pull-down transistors PD-1, PD-2 (see FIG. 4B and FIG. 4C). In some implementations, the dopant concentration of the fin structures of the p-well strap structures 398 is at least three times greater than a dopant concentration of the fin structures of pass-gate transistors PG-1, PG-2 and/or pull-down transistors PD-1, PD-2. Increasing the dopant concentration of the fin structures of p-well strap structures 398 can reduce pick-up resistance and latch-up in SRAM array 300. Further, in contrast to the fin structures of pass-gate transistors PG-1, PG-2 and/or pull-down transistors PD-1, PD-2, the fin structures of p-well strap structures 398 further include p-type epitaxial source/drain features (in other words, epitaxial source/drain features 340 of p-well strap structures 398 include n-type dopants), which are electrically connected to the voltage source by MLI feature 350 (in particular, respective contacts 360, vias 370, and/or conductive lines 380 disposed in ILD layers 352-358).

Figure 5:
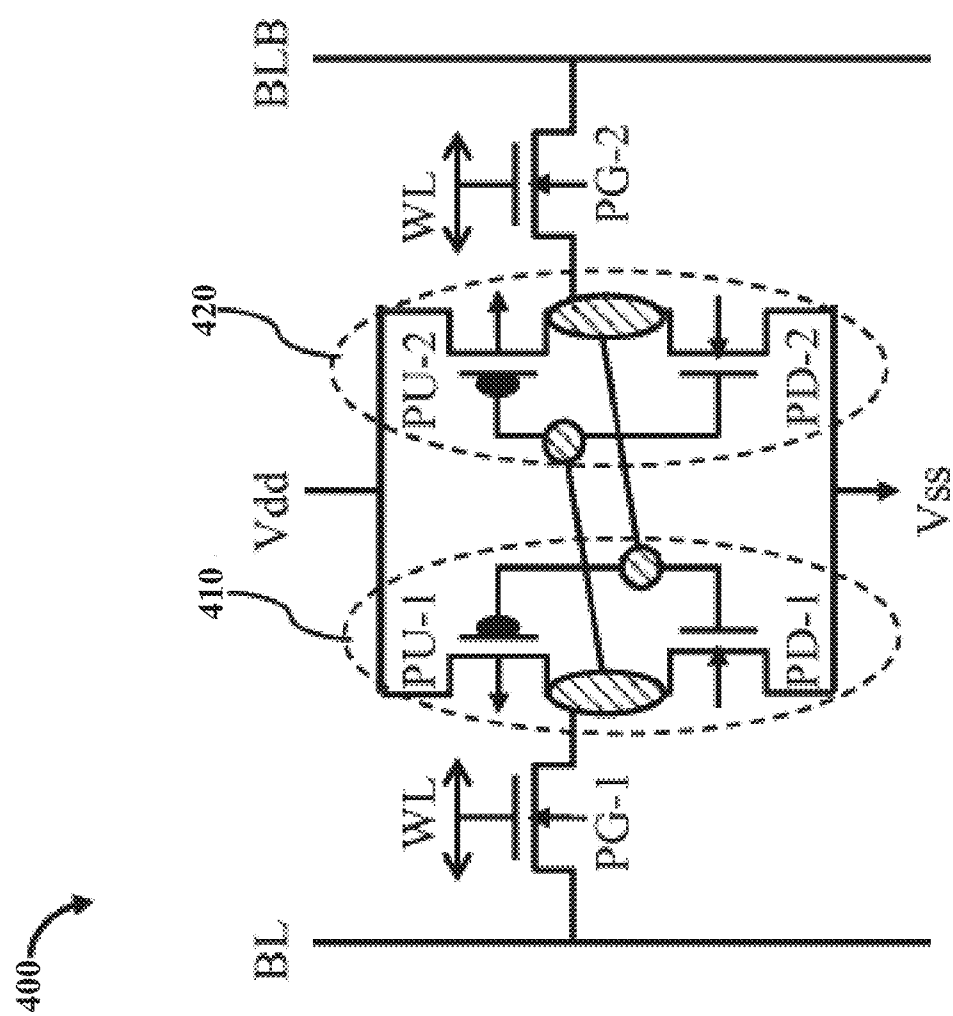
FIG. 5 is a circuit diagram of a single-port SRAM cell, which can be implemented in a memory cell of a memory array, according to various aspects of the present disclosure.

FIG. 5 is a circuit diagram of a single-port SRAM cell 400, which can be implemented in a memory cell of a SRAM array, according to various aspects of the present disclosure. In some implementations, SRAM cell 400 is implemented in one or more memory cells 101 of memory array 100 (FIG. 2), memory array 200 (FIG. 3), or SRAM memory 400 (FIGS. 4A-4C). FIG. 5 has been simplified for the sake of clarity to better understand the inventive concepts of the present disclosure. Additional features can be added in single-port SRAM cell 400, and some of the features described below can be replaced, modified, or eliminated in other embodiments of single-port SRAM cell 400.

Single-port SRAM cell 400 includes six transistors: a pass-gate transistor PG-1, a pass-gate transistor PG-2, a pull-up transistor PU-1, a pull-up transistor PU-2, a pull-down transistor PD-1, and a pull-down transistor PD-1. Single-port SRAM cell 400 is thus alternatively referred to as a 6T SRAM cell. In operation, pass-gate transistor PG-1 and pass-gate transistor PG-2 provide access to a storage portion of SRAM cell 400, which includes a cross-coupled pair of inverters, an inverter 410 and an inverter 420. Inverter 410 includes pull-up transistor PU-1 and pull-down transistor PD-1, and inverter 420 includes pull-up transistor PU-2 and pull-down transistor PD-2. In some implementations, pull-up transistors PU-1, PU-2 are configured as p-type FinFETs, such as p-type FinFET 18A (FIGS. 1A-1D), and pull-down transistors PD-1, PD-2 are configured as n-type FinFETs, such as n-type FinFET 18B described above (FIGS. 1A-1D). For example, pull-up transistors PU-1, PU-2 each include a gate structure disposed over a channel region of an n-type fin structure (including one or more n-type fins), such that the gate structure interposes p-type source/drain regions of the n-type fin structure (for example, p-type epitaxial source/drain features), where the gate structure and the n-type fin structure are disposed over an n-type well region; and pull-down transistors PD-1, PD-2 each include a gate structure disposed over a channel region of a p-type fin structure (including one or more p-type fins), such that the gate structure interposes n-type source/drain regions of the p-type fin structure (for example, n-type epitaxial source/drain features), where the gate structure and the p-type fin structure are disposed over a p-type well region. In some implementations, pass-gate transistors PG-1, PG-2 are also configured as n-type FinFETs, such as n-type FinFET 18B described above (FIGS. 1A-1D). For example, pass-gate transistors PG-1, PG-2 each include a gate structure disposed over a channel region of a p-type fin structure (including one or more p-type fins), such that the gate structure interposes n-type source/drain regions of the p-type fin structure (for example, n-type epitaxial source/drain features), where the gate structure and the p-type fin structure are disposed over a p-type well region.

A gate of pull-up transistor PU-1 interposes a source (electrically coupled with a power supply voltage ($V_{DD}$)) and a first common drain (CD1), and a gate of pull-down transistor PD-1 interposes a source (electrically coupled with a power supply voltage ($V_{SS}$)) and the first common drain. A gate of pull-up transistor PU-2 interposes a source (electrically coupled with power supply voltage ($V_{DD}$)) and a second common drain (CD2), and a gate of pull-down transistor PD-2 interposes a source (electrically coupled with power supply voltage ($V_{SS}$)) and the second common drain. In some implementations, the first common drain (CD1) is a storage node (SN) that stores data in true form, and the second common drain (CD2) is a storage node (SNB) that stores data in complementary form. The gate of pull-up transistor PU-1 and the gate of pull-down transistor PD-1 are coupled with the second common drain, and the gate of pull-up transistor PU-2 and the gate of pull-down transistor PD-2 are coupled with the first common drain. A gate of pass-gate transistor PG-1 interposes a source (electrically coupled with a bit line BL) and a drain, which is electrically coupled with the first common drain. A gate of pass-gate transistor PG-2 interposes a source (electrically coupled with a complementary bit line BLB) and a drain, which is electrically coupled with the second common drain. The gates of pass-gate transistors PG-1, PG-2 are electrically coupled with a word line WL. In some implementations, pass-gate transistors PG-1, PG-2 provide access to storage nodes SN, SNB during read operations and/or write operations. For example, pass-gate transistors PG-1, PG-2 couple storage nodes SN, SN-B respectively to bit lines BL, BLB in response to voltage applied to the gates of pass-gate transistors PG-1, PG-2 by WLs.

Figure 6:
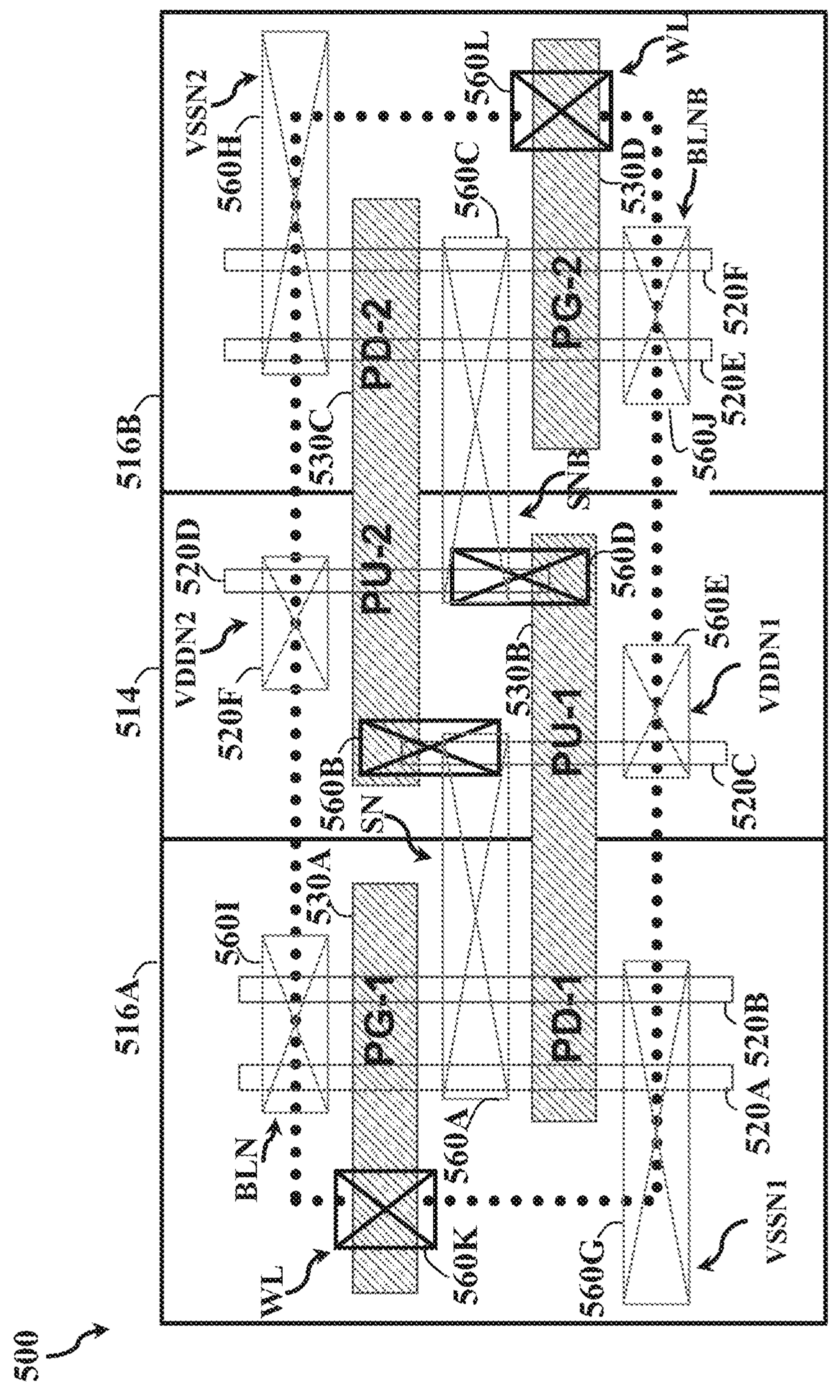
FIG. 6 is a plan view of a single-port SRAM cell, which can be implemented in a memory cell of a memory array, according to various aspects of the present disclosure.

FIG. 6 is a plan view of a single-port SRAM cell 500, which can be implemented in a memory cell of a SRAM array, according to various aspects of the present disclosure. In some implementations, SRAM cell 500 is implemented in one or more memory cells 101 of memory array 100 (FIG. 2), memory array 200 (FIG. 3), or SRAM memory 400 (FIGS. 4A-4C). FIG. 6 has been simplified for the sake of clarity to better understand the inventive concepts of the present disclosure. Additional features can be added in single-port SRAM cell 500, and some of the features described below can be replaced, modified, or eliminated in other embodiments of single-port SRAM cell 500.

In FIG. 6, single-port SRAM cell 500 includes six transistors: a pass-gate transistor PG-1, a pass-gate transistor PG-2, a pull-up transistor PU-1, a pull-up transistor PU-2, a pull-down transistor PD-1, and a pull-down transistor PD-1. Single-port SRAM cell 500 is thus alternatively referred to as a 6T SRAM cell. Single-port SRAM cell 500 includes an n-well 514 (similar to doped region 14 described above with reference to FIGS. 1A-1D) disposed between a p-well 516A and a p-well 516B (both similar to doped region 16 described above with reference to FIGS. 1A-1D). Pull-up transistors PU-1, PU-2 are disposed over n-well 514; pull-down transistor PD-1 and pass-gate transistor PG-1 are disposed over p-well 516A; and pull-down transistor PD-2 and pass-gate transistor PG-2 are disposed over p-well 516B. In some implementations, pull-up transistors PU-1, PU-2 are configured as p-type FinFETs, such as p-type FinFET 18A (FIGS. 1A-1D), and pull-down transistors PD-1, PD-2 and pass-gate transistors PG-1, PG-2 are configured as n-type FinFETs, such as n-type FinFET 18B described above (FIGS. 1A-1D). In the depicted embodiment, pull-down transistor PD-1 and pass-gate transistor PG-1 are multi-fin FinFETs (including, for example, a fin 520A and a fin 520B), pull-up transistor PU-1 is a single fin FinFET (including, for example, a fin 520C), pull-up transistor PU-2 is a single fin FinFET (including, for example, a fin 520D), and pull-down transistor PD-2 and pass-gate transistor PG-2 are multi-fin FinFETs (including, for example, a fin 520E and a fin 520F). Fins 520A-520F are similar to fins 20A-20H described above with reference to FIGS. 1A-1D. For example, fin 520A, fin 520B, fin 520E, and fin 520F are p-type doped fins, and fin 520C and fin 520D are n-type doped fins. A gate structure 530A is disposed over fins 520A, 520B; a gate structure 530B is disposed over fins 520A-520D; a gate structure 530C is disposed over fins 520C-520F; and a gate structure 530D is disposed over fins 520E, 520F. A gate of pass-gate transistor PG-1 is formed from gate structure 530A, a gate of pull-down transistor PD-1 is formed from gate structure 530B, a gate of pull-up transistor PU-1 is formed from gate structure 530B, a gate of pull-up transistor PU-2 is formed from gate structure 530C, a gate of pull-down transistor PD-2 is formed from gate structure 530C, and a gate of pass-gate transistor PG-2 is formed from gate structure 530D. Gate structures 530A-530D are similar to gate structures 30A-30H described above with reference to FIGS. 1A-1D.

A device-level contact 560A electrically connects a drain region of pull-down transistor PD-1 (formed by fins 520A, 520B (which can include n-type epitaxial source/drain features)) and a drain region of pull-up transistor PU-1 (formed by fin 520C (which can include p-type epitaxial source/drain features)), such that a common drain of pull-down transistor PD-1 and pull-up transistor PU-1 form a storage node SN. A device-level contact 560B electrically connects a gate of pull-up transistor PU-2 (formed by gate structure 530C) and a gate of pull-down transistor PD-2 (also formed by gate structure 530C) to storage node SN. A device-level contact 560C electrically connects a drain region of pull-down transistor PD-2 (formed by fins 520E, 520F (which can include n-type epitaxial source/drain features)) and a drain region of pull-up transistor PU-2 (formed by fin 520D (which can include p-type epitaxial source/drain features)), such that a common drain of pull-down transistor PD-2 and pull-up transistor PU-2 form a storage node SNB. A device-level contact 560D electrically connects a gate of pull-up transistor PU-1 (formed by gate structure 530B) and a gate of pull-down transistor PD-1 (also formed by gate structure 530B) to storage node SNB. A device-level contact 560E electrically connects a source region of pull-up transistor PU-1 (formed by fin 520C (which can include p-type epitaxial source/drain features)) to a power supply voltage $V_{DD}$ at a voltage node VDDN1, and a device-level contact 560F electrically connects a source region of pull-up transistor PU-2 (formed by fin 520D (which can include p-type epitaxial source/drain features)) to power supply voltage $V_{DD}$ at a voltage node VDDN2. A device-level contact 560G electrically connects a source region of pull-down transistor PD-1 (formed by fins 520A, 520B (which can include n-type epitaxial source/drain features)) to a power supply voltage $V_{SS}$ at a voltage node VSSN1, and a device-level contact 560H electrically connects a source region of pull-down transistor PD-2 (formed by fins 520E, 520F (which can include n-type epitaxial source/drain features)) to power supply voltage $V_{SS}$ at a voltage node VSSN2. A device-level contact 560I electrically connects a source region of pass-gate transistor PG-1 (formed by fins 520A, 520B (which can include n-type epitaxial source/drain features)) to a bit line (generally referred to as a bit line node BLN), and a device-level contact 560J electrically connects a source region of pass-gate transistor PG-2 (formed by fins 520E, 520F (which can include n-type epitaxial source/drain features)) to a complementary bit line (generally referred to as a bit line node BLNB). A device-level contact 560K electrically connects a gate of pass-gate transistor PG-1 (formed by gate structure 530A) to a word line WL (generally referred to as a word line node WL), and a device-level contact 560L electrically connects a gate of pass-gate transistor PG-2 (formed by gate structure 530D) to the word line. Device-level contacts 560A-560K are similar to gate device-level contacts 60A-60J described above with reference to FIGS. 1A-1D. Though not depicted, it is understood that single-port SRAM cell 500 can further include vias and/or conductive lines of a MLI feature electrically connected to device-level contacts 560A-560K.

Figure 7:
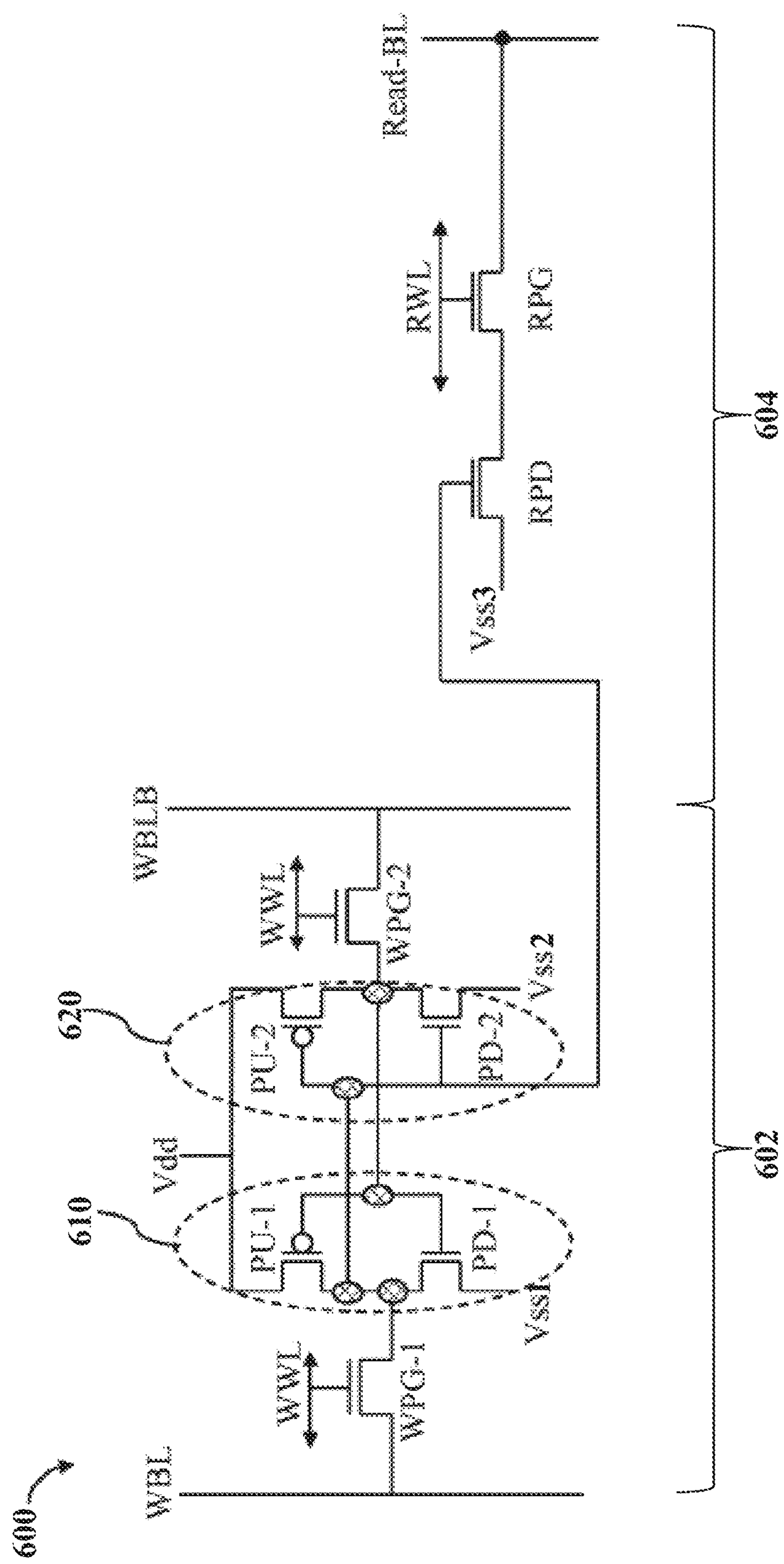
FIG. 7 is a circuit diagram of a dual-port SRAM cell, which can be implemented in a memory cell of a memory array, according to various aspects of the present disclosure.

FIG. 7 is a circuit diagram of a dual-port SRAM cell 600, which can be implemented in a memory cell of a SRAM array, according to various aspects of the present disclosure. In some implementations, SRAM cell 600 is implemented in one or more memory cells 101 of memory array 100 (FIG. 2), memory array 200 (FIG. 3), or SRAM memory 400 (FIGS. 4A-4C). FIG. 7 has been simplified for the sake of clarity to better understand the inventive concepts of the present disclosure. Additional features can be added in dual-port SRAM cell 600, and some of the features described below can be replaced, modified, or eliminated in other embodiments of dual-port SRAM cell 600.

Dual-port SRAM cell 600 includes a write-port portion 602 and a read-port portion 604. Write-port portion 602 includes six transistors: a write pass-gate transistor WPG-1, a write pass-gate transistor WPG-2, a pull-up transistor PU-1, a pull-up transistor PU-2, a pull-down transistor PD-1, and a pull-down transistor PD-1. Read portion 604 includes two transistors: a read pull-down transistor RPD and a read pass-gate transistor RPG. In operation, write pass-gate transistor WPG-1 and write pass-gate transistor WPG-2 provide access to a storage portion of dual-port SRAM cell 600, which includes a cross-coupled pair of inverters, an inverter 610 and an inverter 620. Inverter 610 includes pull-up transistor PU-1 and pull-down transistor PD-1, and inverter 620 includes pull-up transistor PU-2 and pull-down transistor PD-2. In some implementations, pull-up transistors PU-1, PU-2 are configured as p-type FinFETs, such as p-type FinFET 18A (FIGS. 1A-1D), and pull-down transistors PD-1, PD-2 and/or read pull-down transistor RPD are configured as n-type FinFETs, such as n-type FinFET 18B described above (FIGS. 1A-1D). For example, pull-up transistors PU-1, PU-2 each include a gate structure disposed over a channel region of an n-type fin structure (including one or more n-type fins), such that the gate structure interposes p-type source/drain regions of the n-type fin structure (for example, p-type epitaxial source/drain features), where the gate structure and the n-type fin structure are disposed over an n-type well region; and pull-down transistors PD-1, PD-2 and/or read pull-down transistor RPD each include a gate structure disposed over a channel region of a p-type fin structure (including one or more p-type fins), such that the gate structure interposes n-type source/drain regions of the p-type fin structure (for example, n-type epitaxial source/drain features), where the gate structure and the p-type fin structure are disposed over a p-type well region. In some implementations, write pass-gate transistors WPG-1, WPG-2 and/or read pass-gate transistor RPG are also configured as n-type FinFETs, such as n-type FinFET 18B. For example, write pass-gate transistors WPG-1, WPG-2 and/or read pass-gate transistor RPG each include a gate structure disposed over a channel region of a p-type fin structure (including one or more p-type fins), such that the gate structure interposes n-type source/drain regions of the p-type fin structure (for example, n-type epitaxial source/drain features), where the gate structure and the p-type fin structure are disposed over a p-type well region.

A gate of pull-up transistor PU-1 interposes a source (electrically coupled with a power supply voltage $V_{DD}$) and a first common drain (CD1), and a gate of pull-down transistor PD-1 interposes a source (electrically connected with a power supply voltage $V_{SS1}$) and the first common drain. A gate of pull-up transistor PU-2 interposes a source (electrically coupled with power supply voltage $V_{DD}$) and a second common drain (CD2), and a gate of pull-down transistor PD-2 interposes a source (electrically connected with a power supply voltage $V_{SS2}$) and the second common drain. In some implementations, the first common drain (CD1) is a storage node (SN) that stores data in true form, and the second common drain (CD2) is a storage node (SNB) that stores data in complementary form. The gate of pull-up transistor PU-1 and the gate of pull-down transistor PD-1 are coupled with the second common drain, and the gate of pull-up transistor PU-2 and the gate of pull-down transistor PD-2 are coupled with the first common drain. A gate of write pass-gate transistor WPG-1 interposes a source (electrically coupled with a write bit line WBL) and a drain, which is electrically coupled with the first common drain. A gate of write pass-gate transistor WPG-2 interposes a source (electrically coupled with a complementary write bit line WBLB) and a drain, which is electrically coupled with the second common drain. The gates of write pass-gate transistors WPG-1, WPG-2 are electrically coupled with a write word line WWL. In some implementations, write pass-gate transistors WPG-1, WPG-2 provide access to storage nodes SN, SNB during read operations and/or write operations. For example, write pass-gate transistors WPG-1, WPG-2 couple storage nodes SN, SN-B respectively to write bit lines WBL, WBLB in response to voltage applied to the gates of write pass-gate transistors WPG-1, WPG-2 by WWLs. A gate of read pull-down transistor RPD (electrically connected to the gate of pull-up transistor PU-2 and the gate of pull-down transistor PD-2) interposes a source (electrically connected with a power supply voltage Vss3) and a drain (electrically connected with a source of read pass-gate RPG). A gate of read pass-gate RPG is electrically connected to a read word line RWL, where the gate interposes the source and a drain that is electrically connected to a read bit line RBL.

Figure 8:
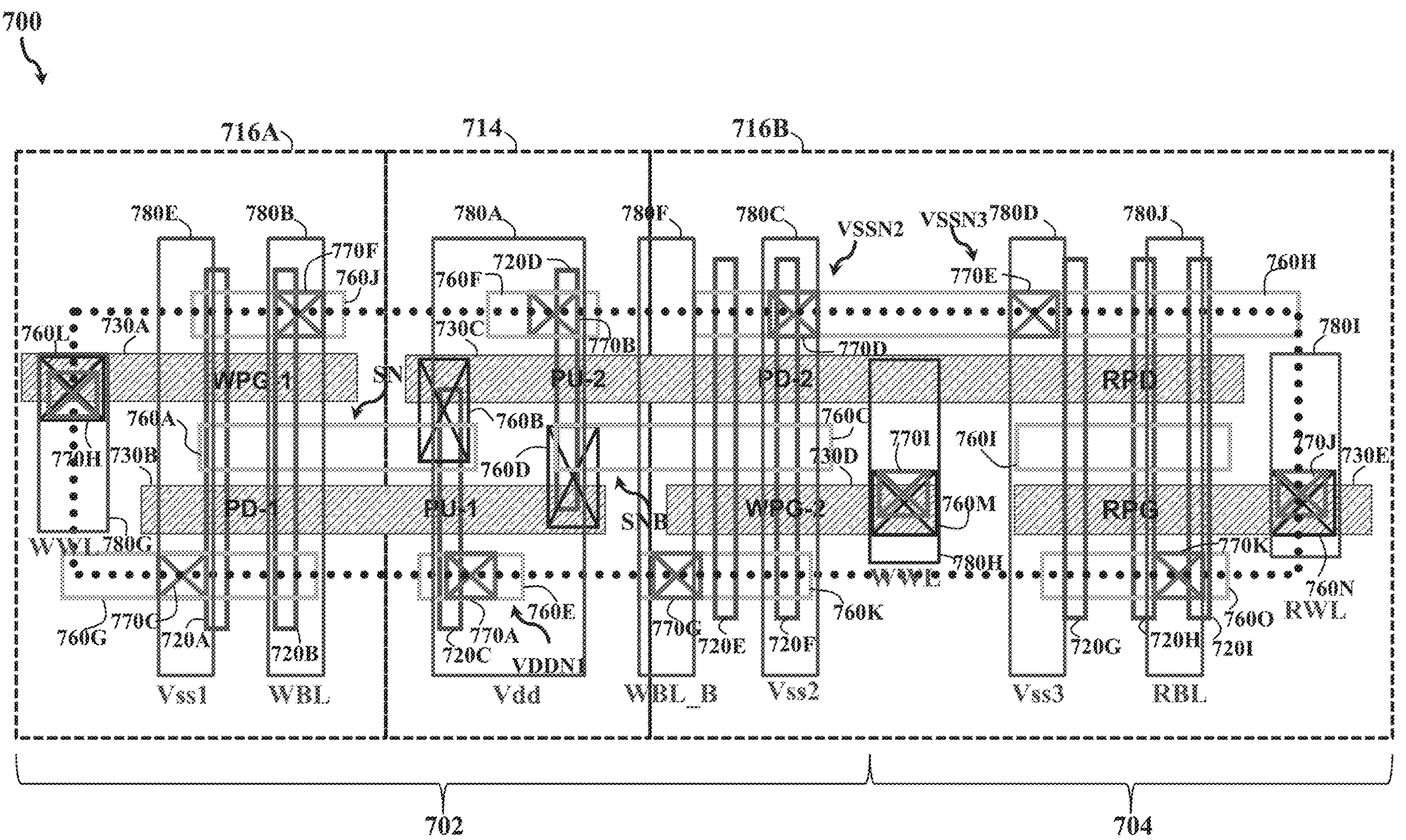
FIG. 8 is a plan view of a dual-port SRAM cell, which can be implemented in a memory cell of a memory array, according to various aspects of the present disclosure.

FIG. 8 is a plan view of a dual-port SRAM cell 700, which can be implemented in a memory cell of a SRAM array, according to various aspects of the present disclosure. In some implementations, SRAM cell 700 is implemented in one or more memory cells 101 of memory array 100 (FIG. 2), memory array 200 (FIG. 3), or SRAM memory 400

(FIGS. 4A-4C). FIG. 8 has been simplified for the sake of clarity to better understand the inventive concepts of the present disclosure. Additional features can be added in dual-port SRAM cell 700, and some of the features described below can be replaced, modified, or eliminated in other embodiments of dual-port SRAM cell 700.

In FIG. 8, dual-port SRAM cell 700 includes a write-port portion 702 and a read-port portion 704. Write-port portion 702 includes six transistors: a write pass-gate transistor WPG-1, a write pass-gate transistor WPG-2, a pull-up transistor PU-1, a pull-up transistor PU-2, a pull-down transistor PD-1, and a pull-down transistor PD-1. Read portion 704 includes two transistors: a read pull-down transistor RPD and a read pass-gate transistor RPG. Dual-port SRAM cell 700 includes an n-well 714 (similar to doped region 14 described above with reference to FIGS. 1A-1D) disposed between a p-well 716A and a p-well 716B (both similar to doped region 16 described above with reference to FIGS. 1A-1D). Pull-up transistors PU-1, PU-2 are disposed over n-well 714; pull-down transistor PD-1 and write pass-gate transistor WPG-1 are disposed over p-well 716A; pull-down transistor PD-2 and write pass-gate transistor WPG-2 are disposed over p-well 716B; and read pull-down transistor RPD and read pass-gate transistor RPG are disposed over p-well 716B. In some implementations, pull-up transistors PU-1, PU-2 are configured as p-type FinFETs, such as p-type FinFET 18A (FIGS. 1A-1D), and pull-down transistors PD-1, PD-2, write pass-gate transistors WPG-1, WPG-2, read pass-gate transistor RPG, and read pull-down transistor RPD are configured as n-type FinFETs, such as n-type FinFET 18B described above (FIGS. 1A-1D). In the depicted embodiment, pull-down transistor PD-1 and write pass-gate transistor WPG-1 are multi-fin FinFETs (including, for example, a fin 720A and a fin 720B), pull-up transistor PU-1 is a single fin FinFET (including, for example, a fin 720C), pull-up transistor PU-2 is a single fin FinFET (including, for example, a fin 720D), and pull-down transistor PD-2 and write pass-gate transistor WPG-2 are multi-fin FinFETs (including, for example, a fin 720E and a fin 720F), and read pull-down transistor RPD and read pass-gate transistor RPG are multi-fin FinFETs (including, for example, a fin 720G, a fin 720H, and a fin 720I). Fins 720A-720I are similar to fins 20A-20H (FIGS. 1A-1D). For example, fin 720A, fin 720B, and fins 720E-720I are p-type doped fins, and fin 720C and fin 720D are n-type doped fins. A gate structure 730A is disposed over fins 720A, 720B; a gate structure 730B is disposed over fins 720A-720D; a gate structure 730C is disposed over fins 720C-720I; a gate structure 730D is disposed over fins 720E, 720F; and a gate structure 730E is disposed over fins 720G-720I. A gate of write pass-gate transistor WPG-1 is formed from gate structure 730A, a gate of pull-down transistor PD-1 is formed from gate structure 730B, a gate of pull-up transistor PU-1 is formed from gate structure 730B, a gate of pull-up transistor PU-2 is formed from gate structure 730C, a gate of pull-down transistor PD-2 is formed from gate structure 730C, a gate of read pull-down transistor RPD is formed from gate structure 730C, a gate of write pass-gate transistor WPG-2 is formed from gate structure 730D, and a gate of read pass-gate transistor RPG is formed from gate structure 730E. Gate structures 730A-730E are similar to gate structures 30A-30H (FIGS. 1A-1D).

A device-level contact 760A electrically connects a drain region of pull-down transistor PD-1 (formed by fins 720A, 720B (which can include n-type epitaxial source/drain features)) and a drain region of pull-up transistor PU-1 (formed by fin 720C (which can include p-type epitaxial source/drain features)), such that a common drain of pull-down transistor PD-1 and pull-up transistor PU-1 form a storage node SN. A device-level contact 760B electrically connects a gate of pull-up transistor PU-2 (formed by gate structure 730C), a gate of pull-down transistor PD-2 (also formed by gate structure 730C), and a gate of read pull-down transistor RPD (also formed by gate structure 730C) to storage node SN. A device-level contact 760C electrically connects a drain region of pull-down transistor PD-2 (formed by fins 720E, 720F (which can include n-type epitaxial source/drain features)) and a drain region of pull-up transistor PU-2 (formed by fin 720D (which can include p-type epitaxial source/drain features)), such that a common drain of pull-down transistor PD-2 and pull-up transistor PU-2 form a storage node SNB. A device-level contact 760D electrically connects a gate of pull-up transistor PU-1 (formed by gate structure 730B) and a gate of pull-down transistor PD-1 (also formed by gate structure 730B) to storage node SNB. A device-level contact 760E and a via 760A electrically connects a source region of pull-up transistor PU-1 (formed by fin 720C (which can include p-type epitaxial source/drain features)) to a power supply voltage $V_{DD}$ (represented by a conductive line 780A) at a voltage node VDDN1, and a device-level contact 760F and a via 760B electrically connects a source region of pull-up transistor PU-2 (formed by fin 720D (which can include p-type epitaxial source/drain features)) to power supply voltage $V_{DD}$ at a voltage node VDDN2. A device-level contact 760G and a via 770C electrically connects a source region of pull-down transistor PD-1 (formed by fins 720A, 720B (which can include n-type epitaxial source/drain features)) to a power supply voltage $V_{SS1}$ (represented by a conductive line 780B) at a voltage node VSSN1; a device-level contact 760H and a via 770D electrically connects a source region of pull-down transistor PD-2 (formed by fins 720E, 720F (which can include n-type epitaxial source/drain features)) to a power supply voltage Vss2 (represented by a conductive line 780C) at a voltage node VSSN2; and device-level contact 760H and a via 770E electrically connects a source region of read pull-down transistor RPD (formed by fins 720G-720I (which can include n-type epitaxial source/drain features)) to a power supply voltage Vss3 (represented by a conductive line 780D) at a voltage node VSSN3. A device-level contact 760I electrically connects drain regions of read pull-down transistor RPD and read pass-gate transistor RPG (formed by fins 720G-720I (which can include n-type epitaxial source/drain features)). A device-level contact 760J and a via 770F electrically connects a source region of write pass-gate transistor WPG-1 (formed by fins 720A, 720B (which can include n-type epitaxial source/drain features)) to a write bit line (represented by a conductive line 780E), and a device-level contact 760K and a via 770G electrically connects a source region of write pass-gate transistor PG-2 (formed by fins 720E, 720F (which can include n-type epitaxial source/drain features)) to a complementary write bit line (represented by a conductive line 780F). A device-level contact 760L and a via 770H electrically connects a gate of write pass-gate transistor PG-1 (formed by gate structure 730A) to a write word line WL (represented by a conductive line 780G), and a device-level contact 760M and a via 770I electrically connects a gate of write pass-gate transistor WPG-2 (formed by gate structure 730D) to a write word line (represented by a conductive line 780H). A device-level contact 760N and via 770J electrically connects a gate of read pass-gate transistor RPG (formed by gate structure 730E) to a read word line WL (represented by a conductive line 780I), and a device-level contact 760O and a via 770K electrically connects a source region of read pass-gate transistor RPG (formed by fins 720G-720I (which can include n-type epitaxial source/drain features)) to a read bit line RBL (represented by a conductive line 780J). Device-level contacts 760A-760O are similar to gate device-level contacts 60A-60J, via contacts 770A-770K are similar to vias 70A-70I, and conductive lines 780A-780J are similar to conductive lines 80A-80G described above with reference to FIGS. 1A-1D.

The present disclosure provides for many different embodiments. Fin-based well straps are disclosed herein for improving performance of memory arrays, such as static random access memory arrays. An exemplary integrated circuit (IC) device includes a FinFET disposed over a doped region of a first type dopant. The FinFET includes a first fin structure doped with a first dopant concentration of the first type dopant and first source/drain features of a second type dopant. The IC device further includes a fin-based well strap disposed over the doped region of the first type dopant. The fin-based well strap connects the doped region to a voltage. The fin-based well strap includes a second fin structure doped with a second dopant concentration of the first type dopant and second source/drain features of the first type dopant. The second dopant concentration is greater than (for example, at least three times greater than) the first dopant concentration. In some implementations, the second dopant concentration is at least three times greater than the first dopant concentration. In some implementations, the first type dopant is a p-type dopant and the second type dopant is an n-type dopant. In some implementations, the first type dopant is an n-type dopant and the second type dopant is a p-type dopant. In some implementations, the doped region has a third dopant concentration of the first type dopant, wherein the third dopant concentration is greater than the first dopant concentration and less than the second dopant concentration. In some implementations, the FinFET includes a first gate structure that traverses the first fin structure, such that the first gate structure is disposed between the first source/drain features. In some implementations, the fin-based well strap includes a second gate structure that traverses the second fin structure, such that the second gate structure is disposed between the second source/drain features.

In some implementations, the integrated circuit device of further includes a multi-layer interconnect structure. The multi-layer interconnect structure includes a first device-level contact disposed on at least one of the first source/drain features, a second device-level contact disposed on at least one of the second source/drain features, a first via disposed on the first device-level contact, a second via disposed on the second device-level contact, and a first metal line. The first via electrically connects the at least one of the first source/drain feature to the first metal line and the second via electrically connects the at least one of the second source/drain features to the first metal line. In some implementations, the FinFET is a first FinFET, the fin-based well strap is a first fin-based well strap, the doped region is a first doped region, and the voltage is a first voltage. In such implementations, the integrated circuit further includes a second FinFET and a second fin-based well strap disposed over a second doped region of the second type dopant. The second FinFET includes a third fin structure doped with a third dopant concentration of the second type dopant and third source/drain features of the first type dopant. The second fin-based well strap includes a fourth fin structure doped with a fourth dopant concentration of the second type dopant and fourth source/drain features of the second type dopant. The fourth dopant concentration is greater than the third dopant concentration. The second fin-based well strap connects the second doped region to a second voltage. In some implementations, the first type dopant is a p-type dopant and the second type dopant is an n-type dopant. In some implementations, the fourth dopant concentration is at least three times greater than the third dopant concentration.

An exemplary memory array includes a first row of well strap cells and a second row of well strap cells and a plurality of memory cells arranged in columns and rows. The plurality of memory cells are disposed between the first row of well strap cells and the second row of well strap cells, such that each column of memory cells is disposed between a first well strap cell and a second well strap cell. Each of the memory cells include a FinFET disposed over a doped region of a first dopant type. The FinFET includes a first fin structure doped with a first dopant concentration of the first type dopant and first source/drain features of a second type dopant. The first well strap cell and the second well strap cell each include a fin-based well strap disposed over the doped region of the first type dopant. The fin-based well strap includes a second fin structure doped with a second dopant concentration of the first type dopant and second source/drain features of the first type dopant. The second dopant concentration is greater than the first dopant concentration. The fin-based well strap connects the doped region of the first type dopant to a voltage. In some implementations, the plurality of memory cells includes a first memory cell array and a second memory cell array. In such implementations, the memory array can further include a third row of well strap cells disposed between the first memory cell array and the second memory cell array.

In some implementations, the second dopant concentration is at least three times greater than the first dopant concentration. In some implementations, the FinFET is a first FinFET, the doped region is a first doped region, and the fin-based well strap is a first fin-based well strap. In such implementations, each of the memory cells further include a second FinFET disposed over a second doped region of the second type dopant. The second FinFET includes a third fin structure doped with a third dopant concentration of the second type dopant and third source/drain features of the first type dopant. In furtherance of such implementations, the first well strap cell and the second well strap cell each include a second fin-based well strap disposed over the second doped region. The second fin-based well strap includes a fourth fin structure doped with a fourth dopant concentration of the second type dopant and fourth source/drain features of the second type dopant. The fourth dopant concentration is greater than the third dopant concentration. The second fin-based well strap connects the second doped region to a second voltage. In some implementations, the second dopant concentration is at least three times greater than the first dopant concentration, and the fourth dopant concentration is at least three times greater than the third dopant concentration. In some implementations, the first FinFET is a pull-down transistor, and the second FinFET is a pull-up transistor.

Another exemplary integrated circuit device includes a p-type well disposed in a substrate, an n-type FinFET disposed over the p-type well, and a p-type well strap disposed over the p-type well. The n-type FinFET has a first p-type fin structure electrically connected to the p-type well and a first gate structure disposed over the first p-type fin structure, such that the first gate structure interposes n-type source/drain features of the n-type FinFET. The p-type well strap has a second p-type fin structure electrically connected to the p-type well and a second gate structure disposed over the second p-type fin structure, such that the second gate structure interposes p-type source/drain features of the p-type well strap. The first p-type fin structure has a first p-type dopant concentration and the second p-type fin structure has a second p-type dopant concentration that is greater than the first p-type dopant concentration. In some implementations, the second p-type dopant concentration is at least three times greater than the first p-type dopant concentration. In some implementations, the n-type FinFET is a portion of a memory cell, and the p-type well strap is a portion of a well strap cell. In some implementations, the p-type well has a third p-type dopant concentration that is greater than the first p-type dopant concentration and less than the second p-type dopant concentration.

Another exemplary integrated circuit device includes an n-type well disposed in a substrate, a p-type FinFET disposed over the n-type well, and an n-type well strap disposed over the n-type well. The p-type FinFET has a first n-type fin structure electrically connected to the n-type well and a first gate structure disposed over the first n-type fin structure, such that the first gate structure interposes p-type source/drain features of the p-type FinFET. The n-type well strap has a second n-type fin structure electrically connected to the n-type well and a second gate structure disposed over the second n-type fin structure, such that the second gate structure interposes n-type source/drain features of the n-type well strap. The first n-type fin structure has a first n-type dopant concentration and the second n-type fin structure has a second n-type dopant concentration that is greater than the first n-type dopant concentration. In some implementations, the second n-type dopant concentration is at least three times greater than the first n-type dopant concentration. In some implementations, the p-type FinFET is a portion of a memory cell, and the n-type well strap is a portion of a well strap cell. In some implementations, the p-type well has a third n-type dopant concentration that is greater than the first n-type dopant concentration and less than the second n-type dopant concentration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:

a p-well and an n-well disposed in a substrate;

a single-port static random access memory (SRAM) cell that spans the p-well and the n-well, wherein the single-port SRAM cell includes:

first type FinFETs disposed over the p-well, wherein each of the first type FinFETs includes a first p-doped fin structure and first n-doped epitaxial source/drain features, and wherein a first one and a second one of the first type FinFETs are connected to a first voltage, a third one of the first type FinFETs is connected to a word line and a bit line, and a fourth one of the first type FinFETs is connected to the word line and a bit line bar, and second type FinFETs disposed over the n-well, wherein each of the second type FinFETs includes a first n-doped fin structure and first p-doped epitaxial source/drain features, and wherein each of the second type FinFETs is connected to a second voltage; and a well strap cell that spans the p-well and the n-well, wherein the well strap cell includes:

a first type dummy FinFET disposed over the n-well, wherein the first type dummy FinFET includes a second n-doped fin structure and second n-doped epitaxial source/drain features, wherein the first type dummy FinFET connects the n-well to the first voltage, and a second type dummy FinFET disposed over the p-well, wherein the second type dummy FinFET includes a second p-doped fin structure and second p-doped epitaxial source/drain features, wherein the second type dummy FinFET connects the p-well to the second voltage.

2. The device of claim 1, wherein:

a first n-dopant concentration of the second n-doped fin structure is greater than a second n-dopant concentration of the first n-doped fin structure; and a first p-dopant concentration of the second p-doped fin structure is greater than a second p-dopant concentration of the first p-doped fin structure.

3. The device of claim 2, wherein the first n-dopant concentration is at least three times greater than the second n-dopant concentration and the first p-dopant concentration is at least three times greater than the second p-dopant concentration.

4. The device of claim 2, wherein:

the p-well has a third p-dopant concentration that is greater than the second p-dopant concentration and less than the first p-dopant concentration; and the n-well has a third n-dopant concentration that is greater than the second n-dopant concentration and less than the first n-dopant concentration.

5. The device of claim 1, wherein the first p-doped fin structure of the first one, the second one, the third one, and the fourth one of the first type FinFETs each include two p-doped fins and the first n-doped fin structure of the second type FinFETs includes a single n-doped fin.

6. The device of claim 1, wherein the well strap cell is directly adjacent to and shares a boundary with the single-port SRAM cell.

7. The device of claim 1, wherein the well strap cell is spaced a distance from the the single-port SRAM cell.

8. The device of claim 1, wherein the first p-doped fin structure, the second p-doped fin structure, the first n-doped fin structure, and the second n-doped fin structure extend along the same lengthwise direction.

9. The device of claim 1, wherein a first contact and a second contact are disposed over and connected to the second p-doped fin structure and a third contact and a fourth contact are disposed over and connected to the second n-doped fin structure.

10. The device of claim 1, wherein the second n-doped fin structure of the first type dummy FinFET includes two n-doped fins and the second p-doped fin structure of the second type dummy FinFET includes two p-doped fins, wherein a first spacing between the two n-doped fins is less than a second spacing between the two p-doped fins.

11. A device comprising:

a p-well and an n-well disposed in a substrate;

a double-port static random access memory (SRAM) cell that spans the p-well and the n-well, wherein the double-port SRAM cell includes:

first type FinFETs disposed over the p-well, wherein each of the first type FinFETs includes a first p-doped fin structure and first n-doped epitaxial source/drain features, and wherein a first one, a second one, and a third one of the first type FinFETs are connected to a first voltage, a fourth one of the first type FinFETs is connected to a write word line and a bit line, a fifth one of the first type FinFETs is connected to the write word line and a write bit line bar, and a sixth one of the first type FinFETs is connected to a read word line and a read bit line, and second type FinFETs disposed over the n-well, wherein each of the second type FinFETs includes a first n-doped fin structure and first p-doped epitaxial source/drain features, and wherein each of the second type FinFETs is connected to a second voltage; and a well strap cell that spans the p-well and the n-well, wherein the well strap cell includes:

a first type dummy FinFET disposed over the n-well, wherein the first type dummy FinFET includes a second n-doped fin structure and second n-doped epitaxial source/drain features, wherein the first type dummy FinFET connects the n-well to the first voltage, and a second type dummy FinFET disposed over the p-well, wherein the second type dummy FinFET includes a second p-doped fin structure and second p-doped epitaxial source/drain features, wherein the second type dummy FinFET connects the p-well to the second voltage.

12. The device of claim 11, wherein:

a first n-dopant concentration of the second n-doped fin structure is greater than a second n-dopant concentration of the first n-doped fin structure; and a first p-dopant concentration of the second p-doped fin structure is greater than a second p-dopant concentration of the first p-doped fin structure.

13. The device of claim 12, wherein the first n-dopant concentration is at least three times greater than the second n-dopant concentration and the first p-dopant concentration is at least three times greater than the second p-dopant concentration.

14. The device of claim 12, wherein:

the p-well has a third p-dopant concentration that is greater than the second p-dopant concentration and less than the first p-dopant concentration; and the n-well has a third n-dopant concentration that is greater than the second n-dopant concentration and less than the first n-dopant concentration.

15. The device of claim 11, wherein the first p-doped fin structure of the first one, the second one, the third one, the fourth one, the fifth one, and the sixth one of the first type FinFETs each include two p-doped fins and the first n-doped fin structure of the second type FinFETs includes a single n-doped fin.

16. The device of claim 11, wherein the p-well includes a first p-well portion and a second p-well portion, wherein the first one and the fourth one of the first type FinFETs are disposed over the first p-well portion, the second one, the third one, the fifth one, and the sixth one of the first type FinFETs are disposed over the second p-well portion, and a first width of the first p-well portion is less than the a second width of the second p-well portion.

17. A method comprising:

forming a p-well and an n-well in a substrate;

forming a static random access memory (SRAM) cell that spans the p-well and the n-well, wherein the SRAM cell includes:

first type FinFETs disposed over the p-well, wherein each of the first type FinFETs includes a first p-doped fin structure and first n-doped epitaxial source/drain features, and wherein a first one and a second one of the first type FinFETs are connected to a first voltage, a third one of the first type FinFETs is connected to a word line and a bit line, and a fourth one of the first type FinFETs is connected to the word line and a bit line bar, and second type FinFETs disposed over the n-well, wherein each of the second type FinFETs includes a first n-doped fin structure and first p-doped epitaxial source/drain features, and wherein each of the second type FinFETs is connected to a second voltage; and forming a well strap cell that spans the p-well and the n-well, wherein the well strap cell includes:

a first type dummy FinFET disposed over the n-well, wherein the first type dummy FinFET includes a second n-doped fin structure and second n-doped epitaxial source/drain features, wherein the first type dummy FinFET connects the n-well to the first voltage, and a second type dummy FinFET disposed over the p-well, wherein the second type dummy FinFET includes a second p-doped fin structure and second p-doped epitaxial source/drain features, wherein the second type dummy FinFET connects the p-well to the second voltage; and wherein the forming the SRAM cell and the well strap cell includes:

doping the first n-doped fin structure with a first n-dopant concentration and the first p-doped fin structure with a first p-dopant concentration, and doping the second n-doped fin structure with a second n-dopant concentration and the second p-doped fin structure with a second p-dopant concentration, wherein the second n-dopant concentration is greater than the first n-dopant concentration and the second p-dopant concentration is greater than the first p-dopant concentration.

18. The method of claim 17, wherein the word line is a write word line, the bit line is a write bit line, the bit line bar is a write bit line bar, a fifth one of the first type FinFETs is connected to the first voltage, and a sixth one of the first type FinFETs is connected to a read word line and a read bit line.

19. The method of claim 17, wherein:

the forming the p-well includes doping a first region of the substrate with a third p-dopant concentration that is greater than the second p-dopant concentration and less than the first p-dopant concentration; and the forming the n-well includes doping a second region of the substrate with a third n-dopant concentration that is greater than the second n-dopant concentration and less than the first n-dopant concentration.

20. The method of claim 17, wherein:

the first p-doped fin structure of the first one, the second one, the third one, and the fourth one of the first type FinFETs each include two p-doped fins, the first n-doped fin structure of the second type FinFETs includes a single n-doped fin, the second p-doped fin structure of the first type dummy FinFET includes two p-doped fins, and the second n-doped fin structure of the second type dummy FinFET includes two n-doped fins.

* * * * *